US011981849B2

(12) United States Patent
Torimoto et al.

(10) Patent No.: US 11,981,849 B2
(45) Date of Patent: May 14, 2024

(54) SEMICONDUCTOR NANOPARTICLES, METHOD OF PRODUCING THE SEMICONDUCTOR NANOPARTICLES, AND LIGHT-EMITTING DEVICE

(71) Applicants: NATIONAL UNIVERSITY CORPORATION TOKAI NATIONAL HIGHER EDUCATION AND RESEARCH SYSTEM, Nagoya (JP); OSAKA UNIVERSITY, Suita (JP); NICHIA CORPORATION, Anan (JP)

(72) Inventors: Tsukasa Torimoto, Nagoya (JP); Tatsuya Kameyama, Nagoya (JP); Hiroki Yamauchi, Nagoya (JP); Chie Miyamae, Nagoya (JP); Yuki Mori, Nagoya (JP); Susumu Kuwabata, Ibaraki (JP); Taro Uematsu, Suita (JP); Daisuke Oyamatsu, Tokushima (JP)

(73) Assignees: NATIONAL UNIVERSITY CORPORATION TOKAI NATIONAL HIGHER EDUCATION AND RESEARCH SYSTEM, Nagoya (JP); OSAKA UNIVERSITY, Suita (JP); NICHIA CORPORATION, Anan (JP)

( * ) Notice: Subject to any disclaimer, the term of this patent is extended or adjusted under 35 U.S.C. 154(b) by 643 days.

(21) Appl. No.: 17/176,599

(22) Filed: Feb. 16, 2021

(65) Prior Publication Data

US 2021/0179936 A1 Jun. 17, 2021

Related U.S. Application Data

(62) Division of application No. 16/407,939, filed on May 9, 2019, now Pat. No. 10,954,439.

(30) Foreign Application Priority Data

May 10, 2018 (JP) ................................ 2018-091556
Aug. 23, 2018 (JP) ................................ 2018-156357
Nov. 9, 2018 (JP) ................................ 2018-211131

(51) Int. Cl.

*C09K 11/88* (2006.01)
*B82Y 30/00* (2011.01)
*B82Y 40/00* (2011.01)
*F21K 9/64* (2016.01)
*F21Y 115/10* (2016.01)
*H01L 33/50* (2010.01)

(52) U.S. Cl.

CPC .............. *C09K 11/881* (2013.01); *F21K 9/64* (2016.08); *H01L 33/502* (2013.01); *B82Y 30/00* (2013.01); *B82Y 40/00* (2013.01); *F21Y 2115/10* (2016.08); *H01L 2933/0041* (2013.01)

(58) Field of Classification Search

CPC ...... F21K 9/64; F21Y 2115/10; H01L 33/507; H01L 2933/0041; C09K 11/881
See application file for complete search history.

(56) References Cited

U.S. PATENT DOCUMENTS

| | | | | |
|---|---|---|---|---|
| 2010/0193806 | A1 | 8/2010 | Byun | |
| 2011/0012087 | A1 | 1/2011 | Allen et al. | |
| 2012/0205598 | A1 | 8/2012 | Li et al. | |
| 2015/0299567 | A1 | 10/2015 | McDaniel | |
| 2017/0022413 | A1 | 1/2017 | Torimoto et al. | |
| 2018/0291267 | A1* | 10/2018 | Nagano | B82Y 40/00 |
| 2019/0345384 | A1 | 11/2019 | Torimoto et al. | |

FOREIGN PATENT DOCUMENTS

| | | | |
|---|---|---|---|
| CN | 104445098 | A | 3/2015 |
| JP | 2010177656 | A | 8/2010 |
| JP | 2012212862 | A | 11/2012 |
| JP | 2017014476 | A | 1/2017 |
| JP | 2017025201 | A | 2/2017 |
| JP | 2018039971 | A | 3/2018 |
| WO | 2017126164 | A1 | 7/2017 |

OTHER PUBLICATIONS

Yarema, O., et al., Independent Composition and Size Control for Highly Luminescent Indium-Rich Silver Indium Selenide Nanocrystals, ACS NANO, 2015, vol. 9, No. 11, p. 11134-11142, 9 pages.

* cited by examiner

*Primary Examiner* — C Melissa Koslow
(74) *Attorney, Agent, or Firm* — Hunton Andrews Kurth LLP

(57) ABSTRACT

Semiconductor nanoparticles are provided. The semiconductor nanoparticles contains Ag, at least one of In and Ga, and Se. An Ag content is 10 mol % to 30 mol %, a total content of the at least one of In and Ga is 15 mol % to 35 mol %, and an Se content is 35 mol % to 55 mol % in the semiconductor nanoparticles. The semiconductor nanoparticles emit light having an emission spectrum with a peak emission wavelength in a range of 500 nm to 900 nm, and a half bandwidth of 250 meV or less upon irradiation with light in a wavelength range of 350 nm to less than 500 nm.

21 Claims, 10 Drawing Sheets

SEMICONDUCTOR NANOPARTICLES, METHOD OF PRODUCING THE SEMICONDUCTOR NANOPARTICLES, AND LIGHT-EMITTING DEVICE

CROSS-REFERENCE TO RELATED APPLICATIONS

This is a divisional application of U.S. patent application Ser. No. 16/407,939, filed May 9, 2019, now U.S. Pat. No. 10,954,439, which claims priority to Japanese Patent Application No. 2018-091556, filed on May 10, 2018, Japanese Patent Application No. 2018-156357, filed on Aug. 23, 2018, and Japanese Patent Application No. 2018-211131, filed on Nov. 9, 2018, the disclosures of which are hereby incorporated by reference in their entirety.

BACKGROUND

Field of the Invention

The present disclosure relates to semiconductor nanoparticles, a method of producing the semiconductor nanoparticles, and a light-emitting device.

Description of the Related Art

Semiconductor particles with a particle diameter of, for example, 10 nm or less are known to exhibit a quantum size effect, and such nanoparticles are referred to as "quantum dots" (also referred to as "semiconductor quantum dots"). The quantum size effect is a phenomenon where a valence band and a conduction band, each of which is regarded as continuous in bulk particles, become discrete when the particle diameter is on the nanoscale, and the bandgap energy varies in accordance with their particle diameter.

Quantum dots absorb light and change the wavelength of the light corresponding to the bandgap energy. Thus, white light-emitting devices using quantum dots are proposed (for example, refer to Japanese Patent Application Publication No. 2012-212862 and Japanese Patent Application Publication No. 2010-177656). More specifically, light emitted from a light-emitting diode (LED) chip is partially absorbed by quantum dots, and the emission from the quantum dots and the light from the LED chip not absorbed by the quantum dots are mixed to produce white light. In these patent application documents, use of binary quantum dots of Group 12-Group 16 materials, such as CdSe or CdTe, or Group 14-Group 16 materials, such as PbS or PbSe, is proposed. Also, semiconductor nanoparticles not containing Cd nor Pb in consideration of the toxicity of compounds containing these elements, and still capable of band edge emission are proposed (refer to, for example, Japanese Patent Application Publication 2017-014476, and Japanese Patent Application Publication 2018-039971).

SUMMARY

A first aspect of the present disclosure is directed to a method of producing semiconductor nanoparticles. The method includes heat-treating a mixture containing a salt of Ag, a salt containing at least one of In and Ga, an Se supply source, and an organic solvent at a temperature in the range of above 200° C. to 370° C. In the method, the ratio of the number of Ag atoms to the total number of In and Ga atoms in the mixture is above 0.43 to 2.5.

A second aspect of the present disclosure is directed to semiconductor nanoparticles containing Ag, at least one of In and Ga, and Se. In the composition of the semiconductor nanoparticles, Ag content is 10 mol % to 30 mol %, the at least one of In and Ga accounts for 15 mol % to 35 mol %, and Se content is 35 mol % to 55 mol %. Upon irradiation with light in the wavelength range of 350 nm to less than 500 nm, the semiconductor nanoparticles emit light having an emission spectrum with a peak emission wavelength in the range of 500 nm to 900 nm, and a half bandwidth of 250 meV or less.

A third aspect of the present disclosure is directed to a light-emitting device including a light conversion member containing the semiconductor nanoparticles, and a semiconductor light-emitting element.

DETAILED DESCRIPTION

Figure 1:
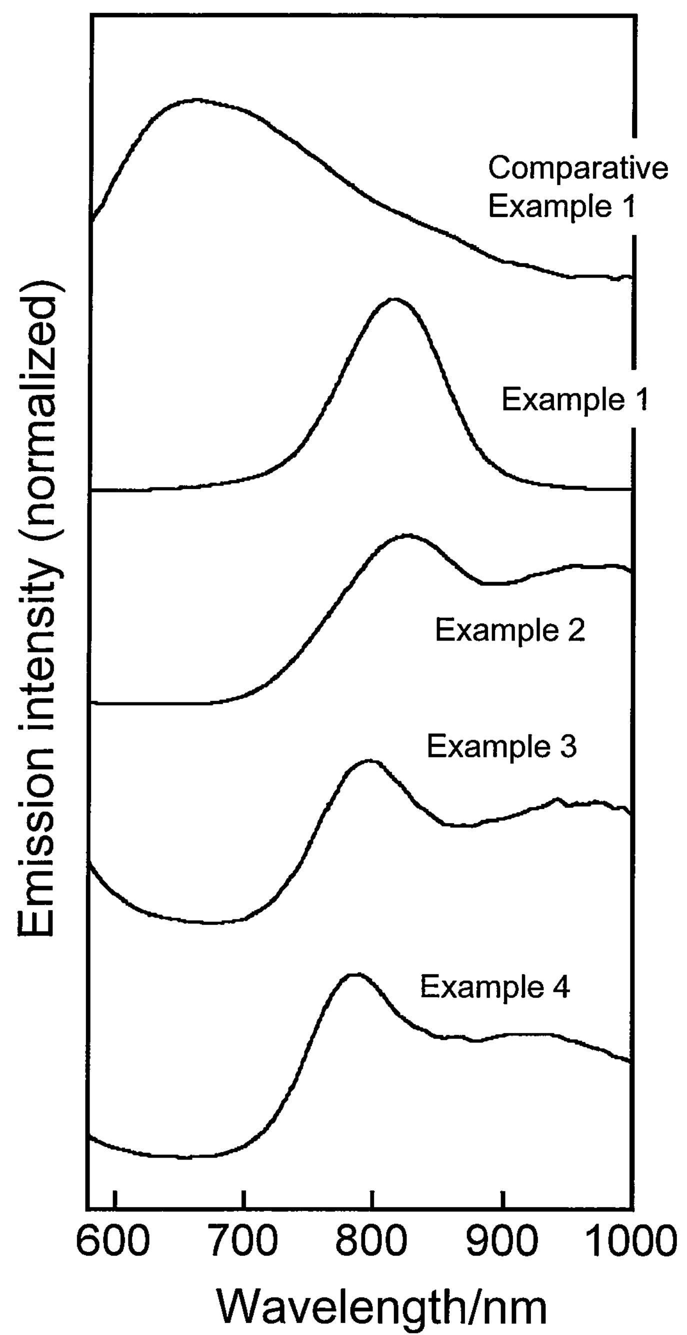
FIG. 1 is a graph showing emission spectra of semiconductor nanoparticles according to examples and a comparative example described in the present disclosure.

An aspect of the present disclosure may provide semiconductor nanoparticles having a composition with low toxicity and capable of exhibiting band edge emission, and another aspect of the present disclosure may provide a method of producing the semiconductor nanoparticles.

As used herein, the term "step" means not only an independent step but also a step which cannot be clearly distinguished from the other steps but can achieve the desired object. For the amount of each component contained in a composition, when a plurality of substances corresponding to the component are present in the composition, the amount of the component means the total amount of the corresponding substances present in the composition unless otherwise specified. The embodiments of the present invention will now be described in detail. However, the embodiments described below are mere examples of the semiconductor nanoparticles and the production method according to the present invention for embodying the technical concept of the present invention, and the present invention is not limited to the semiconductor nanoparticles and the production method described below.

Semiconductor Nanoparticles

The semiconductor nanoparticles contain silver (Ag), at least one of indium (In) and gallium (Ga), and selenium (Se). In the composition, the Ag content is 10 mol % to 30 mol %, the total content of the at least one of In and Ga is 15 mol % to 35 mol %, and the Se content is 35 mol % to 55 mol %. Upon irradiation with light in the wavelength range of 350 nm to less than 500 nm, the semiconductor nanoparticles emit light having an emission spectrum with a peak emission wavelength in the range of 500 nm to 900 nm, or 600 nm to 900 nm, and a half bandwidth of 250 meV or less.

Semiconductor nanoparticles containing Ag, at least one of In and Ga, and Se in the composition typically may have a composition represented by $Ag(In,Ga)Se_2$. To obtain semiconductor nanoparticles having a composition represented by $Ag(In,Ga)Se_2$, the synthesis is usually carried out by selecting the initial ratio of an Ag source, an In source, a Ga source, and an Se source to satisfy the stoichiometric composition. The present inventors examined whether semiconductor nanoparticles consisting of or containing these elements in a non-stoichiometric composition can exhibit band edge emission. As a result, the inventors found that synthesizing nanoparticles containing these element sources in an initial ratio of the number of Ag atoms to the total number of In and Ga atoms of above 0.43 to 2.5 enables the resulting semiconductor nanoparticles, which have a non-stoichiometric composition, to exhibit band edge emission.

The semiconductor nanoparticles containing Ag, at least one of In and Ga, and Se in the composition can exhibit band edge emission in accordance with their shape and size. The semiconductor nanoparticles can have a composition containing neither Cd nor Pb, which are highly toxic, and thus can be used in, for example, products where use of these elements is banned. Thus, the semiconductor nanoparticles can be suitably used as a wavelength conversion substance for a light-emitting device to be used in a liquid crystal display, or as a biomolecular marker.

The Ag content in the composition of the semiconductor nanoparticles may be, for example, 10 mol % to 30 mol %, and preferably 15 mol % to 25 mol %. The total In and Ga content may be, for example, 15 mol % to 35 mol %, and preferably 20 mol % to 30 mol %. The Se content may be, for example, 35 mol % to 55 mol %, and preferably 40 mol % to 55 mol %.

The ratio of the number of In atoms to the total number of In and Ga atoms in the composition of the semiconductor nanoparticles (In/(In+Ga)) may be, for example, 0.01 to 1.0 or less, and preferably 0.1 to 0.99. The ratio of the number of Ag atoms to the total number of In and Ga atoms (Ag/(In+Ga)) may be, for example, 0.3 to 1.2, and preferably 0.5 to 1.1. The ratio of the number of Se atoms to the total number of Ag, In, and Ga atoms (Se/(Ag+In+Ga)) may be, for example, 0.8 to 1.5, and preferably 0.9 to 1.2.

The semiconductor nanoparticles may have a composition represented by, for example, formula (1):

$$Ag_xIn_yGa_{(1-y)}Se_{(x+3)/2} \quad (1)$$

In the formula, x and y respectively satisfy $0.20<x\leq 1.2$ and $0<y\leq 1.0$.

The semiconductor nanoparticles may further contain at least one alkali metal in the composition. Examples of the alkali metal include lithium (Li), sodium (Na), potassium (K), rubidium (Rb), and cesium (Cs). An alkali metal can become a monovalent cation like Ag, and thus Ag in the composition of the semiconductor nanoparticles may be partially substituted by an alkali metal. In particular, Li, which has about the same ion radius as Ag, may be preferably used. When Ag is partially substituted in the composition, the semiconductor nanoparticles may have, for example, a broader band gap with a peak emission wavelength at shorter wavelengths. Although the mechanism is unclear, this seemingly causes the semiconductor nanoparticles to have less lattice defect, and thus an improved emission quantum yield. The semiconductor nanoparticles when containing an alkali metal may emit light having an emission spectrum with a peak emission wavelength in the range of 500 nm to 900 nm, and a half bandwidth of 250 meV or less upon irradiation with light in the wavelength range of 350 nm to less than 500 nm.

When the semiconductor nanoparticles contain an alkali metal (hereinafter also abbreviated as $M^a$) in the composition, the alkali metal content in the composition of the semiconductor nanoparticles may be, for example, greater than 0 mol % and less than 30 mol %, and preferably 1 mol % to 25 mol %. The ratio of the number of alkali metal ($M^a$) atoms to the total number of Ag atoms and alkali metal ($M^a$) atoms ($M^a/(M^a+Ag)$) may be, for example, less than 1, preferably 0.8 or less, and more preferably 0.2 or less. Also, the ratio may be, for example, greater than 0, and preferably 0.05 or more, and more preferably 0.1 or more. The total content of Ag and alkali metal ($M^a$) in the composition of the semiconductor nanoparticles may be, for example, 10 mol % to 30 mol %.

The semiconductor nanoparticles further containing an alkali metal in the composition may have a composition represented by, for example, formula (2):

$$(Ag_pM^a_{(1-p)})_qIn_rGa_{(1-r)}Se_{(q+3)/2} \quad (2)$$

In the formula, p, q, and r respectively satisfy $0<p<1.0$, $0.20<q\leq 1.2$, and $0<r\leq 1.0$, and $M^a$ denotes an alkali metal.

The semiconductor nanoparticles may contain sulfur (S) in the composition. Sulfur (S) may be contained, for example, in the composition of the semiconductor nanoparticles by partially substituting selenium (Se). The S content in the composition of the semiconductor nanoparticles may be, for example, greater than 0 mol % and less than 50 mol %, preferably 1 mol % to 45 mol %, and more preferably 15 mol % to 42 mol %. The total sulfur (S) and selenium (Se) content in the composition of the semiconductor nanoparticles may be, for example, 35 mol % to 55 mol %, and preferably 40 mol % to 55 mol %. Further, the ratio of the number of sulfur (S) atoms to the total number of sulfur (S) atoms and selenium (Se) atoms (S/(S+Se)) in the composition of the semiconductor nanoparticles may be, for example, less than 1, preferably 0.95 or less, more preferably 0.9 or less, still more preferably 0.85 or less, yet still more preferably 0.8 or less, and further even more preferably 0.7 or less. Also, the ratio may be, for example, greater than 0, and preferably 0.1 or more. The semiconductor nanoparticles when containing sulfur may emit light having an emission spectrum with a peak emission wavelength in the range of 500 nm to 900 nm, and a half bandwidth of 250 meV or less upon irradiation with light in the wavelength range of 350 nm to less than 500 nm.

The composition of the semiconductor nanoparticles containing sulfur (S) may be represented by, for example, formula (3a) or (3b) below.

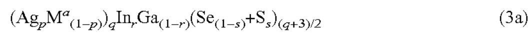

$$(Ag_pM^a_{(1-p)})_qIn_rGa_{(1-r)}(Se_{(1-s)}+S_s)_{(q+3)/2} \quad (3a)$$

In the formula, p, q, r, and s respectively satisfy $0<p\leq1.0$, $0.20<q\leq1.2$, $0<r\leq1.0$, and $0<s<1.0$, and $M^a$ denotes an alkali metal.

$$Ag_qIn_rGa_{(1-r)}(Se_{(1-s)}+S_s)_{(q+3)/2} \quad (3b)$$

In the formula, q, r, and s respectively satisfy $0.20<q\leq1.2$, $0<r\leq1.0$, and $0<s<1.0$.

The composition of the semiconductor nanoparticles is identified through, for example, energy dispersive X-ray (EDX) analysis, X-ray fluorescence (XRF) analysis, or inductively coupled plasma (ICP) emission spectrometry. The ratio such as Ag/(In+Ga) or Se/(Ag+In+Ga) is calculated based on the composition identified by one of these methods.

In the composition of the semiconductor nanoparticles, the Ag component may contain at least one element of Cu and Au by being partially substituted thereby, but may be preferably essentially consists of Ag. The term "essentially" as used herein means that the ratio of the elements other than Ag to Ag may be, for example, 10 mol % or less, preferably 5 mol % or less, and more preferably 1 mol % or less.

In the composition of the semiconductor nanoparticles, the at least one of In and Ga component may contain at least one of Al and Tl by being partially substituted thereby, but may be preferably essentially consists of at least one of In and Ga. The term "essentially" as used herein means that the ratio of the element other than In or Ga to In and Ga may be, for example, 10 mol % or less, preferably 5 mol % or less, and more preferably 1 mol % or less.

In the composition of the semiconductor nanoparticles, the Se component may contain at least one of S and Te elements by being partially substituted thereby, or may be essentially consists of Se. The term "essentially" as used herein means that the ratio of elements other than Se to Se may be, for example, 10 mol % or less, preferably 5 mol % or less, and more preferably 1 mol % or less.

The semiconductor nanoparticles may essentially consist of Ag, at least one of In and Ga, and Se. Also, the semiconductor nanoparticles may essentially consist of Ag, an alkali metal, at least one of In and Ga, and Se. Further, the semiconductor nanoparticles may essentially consist of Ag, at least one of In and Ga, Se, and S. Further, the semiconductor nanoparticles may essentially consist of Ag, an alkali metal, at least one of In and Ga, Se, and S. The term "essentially" is used herein on the understanding that elements other than Ag, an alkali metal, In, Ga, Se, and S may unavoidably be contained attributable to, for example, mixed-in impurities.

The crystal structure of the semiconductor nanoparticles may include at least a tetragonal crystal, and may further include at least one selected from the group consisting of a hexagonal crystal and an orthorhombic crystal. Semiconductor nanoparticles containing Ag, In, and Se, and having a tetragonal, hexagonal, or orthorhombic crystal structure may be typically represented by the composition: $AgInSe_2$, for example, in literature. The semiconductor nanoparticles according to the present embodiment may be regarded as the semiconductor nanoparticles where, for example, In, which is a Group 13 element, may be partially substituted by Ga, which is another Group 13 element. The semiconductor nanoparticles may have a composition represented by, for example, Ag—In—Ga—Se, Ag-$M^a$-In—Ga—Se, Ag-$M^a$-In—Ga—Se—S, or Ag—In—Ga—Se—S.

The semiconductor nanoparticles having a composition represented by, for example, Ag—In—Ga—Se with a hexagonal crystal structure is wurtzite, and with a tetragonal crystal structure is chalcopyrite. The crystal structure of the semiconductor nanoparticles may be identified by, for example, measuring the XRD pattern obtained through X-ray diffraction (XRD) analysis. Specifically, the obtained XRD pattern of the semiconductor nanoparticles, which is regarded as the XRD pattern of the semiconductor nanoparticles represented by the composition: $AgInSe_2$, is compared with known XRD patterns, or XRD patterns obtained through simulations using the crystal structure parameters. If the pattern of the semiconductor nanoparticles in question coincides with a pattern among the known patterns and the simulated patterns, the semiconductor nanoparticles have a crystal structure of the coincided pattern.

An aggregate of the semiconductor nanoparticles may be a mix of the semiconductor nanoparticles with different crystal structures. In this case, peaks attributable to a plurality of crystal structures may be observed in the XRD pattern.

The semiconductor nanoparticles may have an average particle diameter of, for example, 50 nm or less. The average particle diameter may be, for example, 20 nm or less, 10 nm or less, or less than 10 nm. The semiconductor nanoparticles having an average particle diameter of 50 nm or less tend to easily exhibit quantum size effect, and thus easily exhibit band edge emission. The lower limit of the average particle diameter may be, for example, 1 nm.

The particle diameter of the semiconductor nanoparticles may be determined from, for example, a TEM image captured using a transmission electron microscope (TEM). Specifically, the particle diameter of a particle is defined as the length of the longest line segment among the line segments connecting two points on the circumference of the particle and passing through the particle observed in a TEM image.

However, for a rod-shaped particle, the length of the short axis is defined as the particle diameter. A rod-shaped particle is a particle having a short axis and a long axis orthogonal to the short axis, and a ratio of the long axis to the short axis is greater than 1.2 in a TEM image. Examples of the rod-shaped particles include tetragonal (rectangular), elliptical, and polygonal particles observed in a TEM image. The rod-shaped particles may have, for example, a circular, elliptical, or polygonal cross-section as a plane orthogonal to the long axis. Specifically, for a rod-shaped particle with an elliptical cross-section, the length of the long axis is the longest line segment among the line segments connecting two points on the circumference of the particle. For a rod-shaped particle with a rectangular or polygonal cross-section, the length of the long axis is the longest line segment among the line segments parallel to the longest side among the sides defining the perimeter and connecting two points on the perimeter of the particle. The length of the short axis is the longest line segment among the line segments connecting two points on the perimeter of the particle, and orthogonal to the line segment defining the length of the long axis.

The average particle diameter of the semiconductor nanoparticles is determined by measuring particle diameters of all the measurable particles observed in a TEM image captured with 50,000 to 150,000× magnification, and averaging the particle diameters. The term "measurable particles" as used herein refers to particles whose entire images are observable in a TEM image. Thus, in a TEM image, particles partially not in the captured site and observed as partially cut-out particles are not measurable. When a TEM image contains 100 or more measurable particles, their average particle diameter is obtained using the TEM image. When a TEM image contains less than 100 measurable particles, another TEM image is captured in a different site of the particles, and an average particle diameter is obtained by measuring and averaging the particle diameters of 100 or more measurable particles using the two or more TEM images.

The semiconductor nanoparticles may exhibit band edge emission. Upon irradiation with light in the wavelength range of 350 nm to less than 500 nm, the semiconductor nanoparticles may emit light having an emission spectrum with a peak emission wavelength in the range of 500 nm to 900 nm, 650 nm to 880 nm, or 570 nm to 820 nm. The half bandwidth of the semiconductor nanoparticles is 250 meV or less, preferably 200 meV or less, and more preferably 150 meV or less. The lower limit of the half bandwidth is, for example, 30 meV or more. The half bandwidth being 250 meV or less means that when the peak emission wavelength is 600 nm, the half bandwidth is 73 nm or less, when the peak emission wavelength is 700 nm, the half bandwidth is 100 nm or less, and when the peak emission wavelength is 800 nm, the half bandwidth is 130 nm or less, and the semiconductor nanoparticles exhibit band edge emission.

The semiconductor nanoparticles may exhibit other emission, for example, defect emission as well as band edge emission. A typical defect emission has a long emission lifetime and a broad spectrum, and has a peak at longer wavelengths than band edge emission. When both band edge emission and defect emission are exhibited, the intensity of the band edge emission is preferably greater than the intensity of the defect emission.

The band edge emission of the semiconductor nanoparticles may have a different peak site when either the shape or the average particle diameter, in particular the average particle diameter of the semiconductor nanoparticles is changed. For example, the semiconductor nanoparticles having a smaller average particle diameter may have a greater band gap energy because of the quantum size effect, and thus may have a peak wavelength of the band edge emission at shorter wavelengths.

The semiconductor nanoparticles may exhibit band edge emission varying in peak emission wavelength in accordance with the composition of the semiconductor nanoparticles. For example, the semiconductor nanoparticles having a greater ratio of the number of Ga atoms to the total number of In and Ga atoms (Ga/(In+Ga)) in the composition may have a peak emission wavelength of the band edge emission at shorter wavelengths. Also, for example, the semiconductor nanoparticles containing, for example, Li as an alkali metal, and having a greater ratio of the number of the alkali metal atoms ($M^a$) to the total number of Ag atoms and the alkali metal ($M^a$) atoms ($M^a/(Ag+M^a)$) in the composition may have a peak emission wavelength of the band edge emission at shorter wavelengths. Also, for example, the semiconductor nanoparticles containing S as an element partially substituting Se in the composition and having a greater ratio of the number of S atoms to the total number of Se and S atoms (S/(Se+S)) may have a peak emission wavelength of the band edge emission at shorter wavelengths.

The semiconductor nanoparticles may preferably show an absorption spectrum with an exciton peak. An exciton peak is a peak resulting from exciton formation. Thus, the semiconductor nanoparticles showing an absorption spectrum with an exciton peak are made of particles suitable for band edge emission with a small particle diameter distribution, and less crystal defect. The semiconductor nanoparticles having a steeper exciton peak contain a greater amount of particles with a uniform particle diameter and less crystal defect in the aggregate of the particles. Thus, a steep exciton peak seemingly indicates a narrower emission half bandwidth, and improved emission efficiency. The semiconductor nanoparticles may show an absorption spectrum with an exciton peak in the range of, for example, 350 nm to 900 nm.

The semiconductor nanoparticles may emit light with a peak emission wavelength at longer wavelengths than the exciton peak in the absorption spectrum because of stokes shift. The semiconductor nanoparticles showing an absorption spectrum with an exciton peak may have an energy difference between the exciton peak and the peak emission wavelength of, for example, 100 meV or less.

The semiconductor nanoparticles may have a core-shell structure, in which a shell is arranged on the surface of the core particle. The shell is a semiconductor having a greater band gap energy than the core semiconductor. The shell may be formed from a semiconductor containing a Group 13 element and a Group 16 element. Examples of the Group 13 elements include B, Al, Ga, In, and Tl, and examples of the Group 16 elements include 0, S, Se, Te, and Po. The semiconductor forming the shell may contain a single Group 13 element, or two or more Group 13 elements, and a single Group 16 element, or two or more Group 16 elements.

The shell may be formed from a semiconductor formed essentially of a Group 13 element and a Group 16 element. The term "essentially" as used herein means the ratio of elements other than Group 13 and Group 16 elements may be, for example, 10% or less, preferably 5% or less, and more preferably 1% or less when the total number of elements contained in the shell is taken as 100%.

The shell may have, for example, a composition selected in accordance with the band gap energy of the core semiconductor. Alternatively, when, for example, the composition of the shell is predetermined, the core semiconductor may be designed to have a less band gap energy than the shell semiconductor. For example, a semiconductor formed from Ag—In—Se may have a band gap energy of about 1.1 eV to 1.3 eV.

Specifically, the core semiconductor may have a band gap energy of, for example, 2.0 eV to 5.0 eV, and particularly 2.5 eV to 5.0 eV. Also, the shell semiconductor may have a greater band gap energy than the core semiconductor by, for example, about 0.1 eV to 3.0 eV, particularly about 0.3 eV to 3.0 eV, and more particularly about 0.5 eV to 1.0 eV. When the difference in band gap energy between the shell semiconductor and the core semiconductor is greater or equal to the lower limit, emission from the core tends to contain less emission other than band edge emission, and has a greater ratio of band edge emission.

The band gap energy of the core semiconductor and the band gap energy of the shell semiconductor may be preferably selected to form a type-I band alignment where the core band gap energy exists between the shell band gap energy in heterojunction of the core and the shell. The type-I band alignment may allow further appropriate band edge emission from the core. In the type-I alignment, at least 0.1 eV barrier may be preferably formed between the core band gap and the shell band gap, and, for example, 0.2 eV or more or 0.3 eV or more barrier may be formed. The upper limit of the barrier may be, for example, 1.8 eV or less, and particularly 1.1 eV or less. When the barrier is the lower limit or more, the emission from the core tends to contain less emission other than the band edge emission, and the ratio of the band edge emission tends to be greater.

The core semiconductor may contain In or Ga as a Group 13 element. Also, the shell may contain S as a Group 16 element. The semiconductor containing In or Ga, or S tends to have a greater band gap energy than the core semiconductor described above.

The shell semiconductor may have a crystal system in accord with the crystal system of the core semiconductor, and a lattice constant the same as or close to the lattice constant of the core semiconductor. The shell formed from a semiconductor with a crystal system in accord with the crystal system of the core, and a lattice constant close to the lattice constant of the core (including a shell lattice constant close to the core lattice constant when multiplied) may cover the periphery of the core appropriately. For example, the core described above is typically a tetragonal crystal, and examples of the crystal system in accord with a tetragonal crystal include a tetragonal crystal, and an orthorhombic crystal. Ag—In—Se with a tetragonal crystal system has a lattice constant of 0.61038 nm (6.104 Å), 0.61038 nm (6.104 Å), or 1.17118 nm (11.71 Å). The shell covering this core preferably has a tetragonal crystal or cubic crystal system, and the lattice constant or its multiple is preferably close to the lattice constant of, for example, Ag—In—Se. Alternatively, the shell may be amorphous.

Whether a shell of core-shell structured semiconductor nanoparticles is amorphous may be checked by observing the semiconductor nanoparticles using a high-angle annular dark-field scanning transmission electron microscopy (HAADF-STEM). Specifically, if the shell is amorphous, an area with a regular pattern (e.g., stripes or dots) is observed in the center, and an area with no regular pattern is observed in the surroundings through an HAADF-STEM. An HAADF-STEM shows a substance with a regular structure like a crystal substance as an image with a regular pattern, and a substance with no regular structure like an amorphous substance as an image with no regular structure. Thus, an amorphous shell may be observed as an area clearly distinct from the core shown as an image with a regular pattern (with a crystal structure such as a tetragonal crystal system).

The shell formed from GaS tends to be shown as a darker area than the core area in an image obtained through an HAADF-STEM because Ga is a lighter element than Ag and In contained in the core.

Whether an amorphous shell is formed may also be checked by observing the core-shell structured semiconductor nanoparticles according to the present embodiment through a high-resolution transmission electron microscope (HRTEM). In the image obtained through an HRTEM, the core area is observed as a crystal lattice image (an image with a regular pattern), and the shell area is not observed as a crystal lattice image, but as an area of mere black and white contrast with no regular pattern.

The shell preferably forms no solid solution with the core. If the shell forms a solid solution with the core, the two forms a single body. This may ruin the mechanism of the present embodiment where the core is covered with the shell to change the surface state of the core and exhibit band edge emission.

The shell may contain a combination of In and S, a combination of Ga and S, or a combination of In, Ga, and S as a combination of Group 13 elements and Group 16 element, but these are not limitative. The combination of In and S may take a form of indium sulfide, the combination of Ga and S may take a form of gallium sulfide, and the combination of In, Ga, and S may be indium sulfide gallium. The indium sulfide forming the shell may not have a stoichiometric composition ($In_2S_3$). Thus, indium sulfide may be represented by formula $InS_x$ (where x is not necessarily an integer but can be any number, for example, 0.8 to 1.5) in the present specification. Similarly, gallium sulfide may not have a stoichiometric composition ($Ga_2S_3$), and thus gallium sulfide may be represented by formula $GaS_x$ (where x is not necessarily an integer but can be any number, for example, 0.8 to 1.5) in the present specification. Indium sulfide gallium may have a composition represented by $In_{2(1-y)}Ga_{2y}S_3$ (where y is any number greater than 0 and less than 1), or represented by $In_aGa_{1-a}S_b$ (a is any number greater than 0 and less than 1, and b is not necessarily an integer but can be any number).

Indium sulfide having a band gap energy of 2.0 eV to 2.4 eV and a cubic crystal system has a lattice constant of 1.0775 nm (10.775 Å). Gallium sulfide having a band gap energy of about 2.5 eV to 2.6 eV and a tetragonal crystal system has a lattice constant of 0.5215 nm (5.215 Å). However, these are reported values of the crystal systems, and thus, actual core-shell structured semiconductor nanoparticles may have a shell not satisfying these reported values.

Indium sulfide and gallium sulfide are preferably used as a semiconductor forming the shell arranged on the surface of the core. In particular, gallium sulfide, which has a greater band gap energy, is preferably used. The semiconductor nanoparticles containing gallium sulfide as a shell semiconductor may exhibit a stronger band edge emission than the semiconductor nanoparticles containing indium sulfide as a shell semiconductor.

In core-shell structured semiconductor nanoparticles, the core may have an average particle diameter of, for example, 10 nm or less, and particularly 8 nm or less. The core may have an average particle diameter in the range of 2 nm to 10 nm, and particularly in the range of 2 nm to 8 nm. The core with an average particle diameter of not greater than the upper limit may more easily exhibit a quantum size effect.

The shell may have a thickness in the range of 0.1 nm to 50 nm, in the range of 0.1 nm to 10 nm, and particularly in the range of 0.3 nm to 3 nm. The shell with a thickness of not less than the lower limit may sufficiently achieve the effect of covering the core, and more easily exhibit a band edge emission.

The surfaces of the semiconductor nanoparticles may be modified with any compound. The compound modifying the surfaces of the semiconductor nanoparticles is also referred to as surface modifier. The surface modifier has at least one of the functions of, for example, stabilizing the semiconductor nanoparticles to prevent aggregation or growth, improving dispersibility of the semiconductor nanoparticles in a solvent, and compensating the surface defect of the semiconductor nanoparticles to improve emission efficiency.

The surface modifier may be, for example, a nitrogen-containing compound having a hydrocarbon group with a carbon number of 4 to 20, a sulfur-containing compound having a hydrocarbon group with a carbon number of 4 to 20, an oxygen-containing compound having a hydrocarbon group with a carbon number of 4 to 20, or phosphorus-containing compounds having a hydrocarbon group with a carbon number of 4 to 20. Examples of the hydrocarbon group with a carbon number of 4 to 20 include saturated aliphatic hydrocarbon groups, such as butyl, isobutyl, pentyl, hexyl, octyl, ethylhexyl, decyl, dodecyl, hexadecyl, and octadecyl; unsaturated aliphatic hydrocarbon groups, such as oleyl; alicyclic hydrocarbon groups, such as cyclopentyl and cyclohexyl; aromatic hydrocarbon groups having a carbon number of 6 to 10, such as phenyl and naphthyl; and arylalkyl groups, such as benzyl and naphthyl methyl. Of these, saturated aliphatic hydrocarbon groups and unsaturated aliphatic hydrocarbon groups may be preferable. Examples of the nitrogen-containing compounds include amines and amides. Examples of the sulfur-containing compound include thiols. Examples of the oxygen-containing compound include fatty acids. Examples of the phosphorus-containing compounds include phosphines and phosphine oxides.

Preferable examples of the surface modifier include nitrogen-containing compounds having a hydrocarbon group with a carbon number of 4 to 20. Examples of such nitrogen-containing compounds include alkylamines, such as butylamine, isobutylamine, pentylamine, hexylamine, octylamine, ethylhexylamine, decylamine, dodecylamine, hexadecylamine, octadecylamine, and alkenyl amines, such as oleylamine.

Preferable examples of the surface modifier also include sulfur-containing compounds having a hydrocarbon group with a carbon number of 4 to 20. Examples of such sulfur-containing compounds include butane thiol, isobutane thiol, pentane thiol, hexane thiol, octane thiol, ethyl hexane thiol, decane thiol, dodecane thiol, hexadecane thiol, and octadecane thiol.

One of these surface modifiers may be used alone, or two or more of these surface modifiers may be used in combination. For example, a single compound selected from the above examples of the nitrogen-containing compounds (e.g., oleylamine) and a single compound selected from the above examples of the sulfur-containing compounds (e.g., dodecane thiol) may be used in combination.

The semiconductor nanoparticles when having a core-shell structure may have a shell surface modified with a surface modifier containing phosphorus (P) with a negative oxidation number (hereinafter, also referred to as "specific modifier"). The core-shell structured semiconductor nanoparticles having a shell surface modified with a surface modifier containing a specific modifier may have a more improved quantum efficiency in the band edge emission.

The specific modifier contains P with a negative oxidation number as a group 15 element. The oxidation number of P becomes −1 when a hydrogen atom or an hydrocarbon group binds to P, and +1 when an oxygen atom binds to P through a single bond, and thus varies in accordance with the substitution state of P. For example, the oxidation number of P in trialkylphosphine and triarylphosphine is −3, and the oxidation number of P in trialkylphosphine oxide and triarylphosphine oxide is −1.

The specific modifier may contain other Group 15 elements with a negative oxidation number in addition to P with a negative oxidation number. Examples of the other group 15 elements include N, As, and Sb.

The specific modifier may be, for example, a phosphorus compound containing a hydrocarbon group with a carbon number of 4 to 20. Examples of the hydrocarbon group with a carbon number of 4 to 20 include linear or branched saturated aliphatic hydrocarbon groups, such as n-butyl, isobutyl, n-pentyl, n-hexyl, octyl, ethylhexyl, decyl, dodecyl, tetradecyl, hexadecyl, and octadecyl; linear or branched unsaturated aliphatic hydrocarbon groups, such as oleyl; alicyclic hydrocarbon groups, such as cyclopentyl group and cyclohexyl group; aromatic hydrocarbon groups, such as phenyl group and naphthyl group; and arylalkyl groups, such as benzyl group and naphthyl methyl group. Of these, saturated aliphatic hydrocarbon groups and unsaturated aliphatic hydrocarbon groups may be preferable. The specific modifier when having a plurality of hydrocarbon groups may have the same or different hydrocarbon groups.

Specific examples of the specific modifier include tributyl phosphine, triisobutyl phosphine, tripentylphosphine, trihexylphosphine, trioctylphosphine, tris(ethylhexyl)phosphine, tridecylphosphine, tridodecylphosphine, tritetradecylphosphine, trihexadecylphosphine, trioctadecylphosphine, triphenylphosphine, tributyl phosphine oxide, triisobutyl phosphine oxide, tripentylphosphine oxide, trihexylphosphine oxide, trioctylphosphine oxide, tris(ethylhexyl)phosphine oxide, tridecylphosphine oxide, tridodecylphosphine oxide, tritetradecylphosphine oxide, trihexadecylphosphine oxide, trioctadecylphosphine oxide, and triphenylphosphine oxide. At least one selected from the group consisting of these specific examples may be preferable.

Method of Producing Semiconductor Nanoparticles

The method of producing semiconductor nanoparticles includes heat-treating a mixture containing a salt of Ag, a salt containing at least one of In and Ga, an Se supply source, and an organic solvent at a temperature in the range of above 200° C. to 370° C. In the method, the ratio of the number of Ag atoms to the total number of In and Ga atoms in the mixture is above 0.43 to 2.5. The salt containing at least one of In and Ga may contain at least one of a salt of In and a salt of Ga.

In this production method, a salt of Ag and a salt containing at least one of In and Ga, and an Se supply source are charged into an organic solvent such that the mixture has a ratio of the number of Ag atoms to the total number of In and Ga atoms (Ag/(In+Ga)) of above 0.43 to 2.5. Charging the supply sources of these elements to have a ratio of Ag/(In+Ga) in the above range enables producing the Ag—In—Ga—Se semiconductor nanoparticles described above. In other words, in the production method according to the present embodiment, the semiconductor nanoparticles are produced by charging the supply sources of these elements to have a specific ratio as an initial ratio not in accordance with the stoichiometric composition.

In the method of producing semiconductor nanoparticles, the mixture before the heat-treating may further contain an alkali metal salt as appropriate. The mixture containing an alkali metal salt mixture may have a ratio of the number of alkali metal ($M^a$) atoms to the total number of Ag atoms and alkali metal ($M^a$) atoms ($M^a/(M^a+Ag)$) in the mixture of, for example, less than 1, and preferably 0.85 or less, or 0.35 or less. Also, the ratio may be, for example, greater than 0, and preferably 0.1 or more, or 0.15 or more. In other words, in the production method according to this embodiment, the semiconductor nanoparticles may be produced by partially substituting Ag in the composition with an alkali metal.

In the method of producing semiconductor nanoparticles, the mixture before the heat-treating may further contain a sulfur (S) supply source as appropriate. The mixture containing an S supply source may have a ratio of the number of S atoms to the total number of Se and S atoms (S/(Se+S)) in the mixture of, for example, less than 1, preferably 0.95 or less, or 0.9 or less. Also, the ratio is, for example, greater than 0, and preferably 0.1 or more, or 0.4 or more. In other words, in the production method according to this embodiment, the semiconductor nanoparticles may be produced by partially substituting Se in the composition with S.

The semiconductor nanoparticles may be produced, for example, by a method including preparing a mixture containing a salt of Ag, a salt containing at least one of In and Ga, an Se supply source, an organic solvent, and at least one of an alkali metal salt and an S supply source as appropriate, and having a ratio of the number of Ag atoms to the total number of In and Ga atoms of above 0.43 to 2.5, and heat treating the prepared mixture at a temperature in the range of above 200° C. to 370° C.

The semiconductor nanoparticles may also be produced by charging a salt of Ag, a salt containing at least one of In and Ga, an Se supply source, and at least one of an alkali metal salt and an S supply source as appropriate all at once in an organic solvent to prepare a mixture, and heat treating the mixture. This method synthesizes semiconductor nanoparticles in one pot with an easy and reproducible manner. Another method reacts an organic solvent with a salt of Ag to form a complex, then reacts an organic solvent with a salt of In to form a complex, further reacts these complexes with an Se supply source, and allows the reactant to grow into a crystal. In this case, the heat-treating is carried out when reacting the complexes with the Se supply source, and also with an S supply source to be contained as appropriate.

The salt of Ag, the salt containing at least one of In and Ga, and the alkali metal salt may be either an organic or inorganic acid salt. Specific examples of the salt include a nitric acid salt, an acetic acid salt, a sulfuric acid salt, a hydrochloric acid salt, a sulfonic acid salt, and an acetylacetonate salt, and the salt may be preferably at least one selected from the group consisting of these salts, and more preferably an organic acid salt, such as an acetic acid salt. This may be because an organic acid salt is highly soluble in an organic solvent, and enables more uniform reaction.

Examples of the Se supply source include selenium as an elementary substance, and Se-containing compounds, such as selenourea, selenoacetamide, and alkyl selenol.

Examples of the S supply source include sulfur as an elementary substance, and S-containing compounds, such as thiourea, alkylthiourea, thioacetamide, alkylthiol, 2,4-bis(4-methoxyphenyl)-1,3,2,4-dithiadiphosphetane-2,4-disulfide, β-dithiones, such as 2,4-pentanedithione, dithiols, such as 1,2-bis(trifluoromethyl)ethylene-1,2-dithiol, and diethyl dithiocarbamate. Of these, thioacetamide may be preferable in view of quantum yield.

The mixture may contain a salt of Ag, a salt containing at least one of In and Ga, an Se supply source, and at least one of an alkali metal salt and an S supply source as appropriate in such a manner that these substances do not react with one another, or as a complex formed from these substances. Also, the mixture may contain, for example, an Ag complex formed from a salt of Ag, a complex formed from a salt containing at least one of In and Ga, or a complex formed from an Se supply source. A complex is formed, for example, by mixing a salt of Ag, a salt containing at least one of In and Ga, and an Se supply source in an appropriate solvent.

Examples of the organic solvent include amines having a hydrocarbon group with a carbon number of 4 to 20, in particular, alkylamine or alkenylamine with a carbon number of 4 to 20, thiols having a hydrocarbon group with a carbon number of 4 to 20, in particular, alkylthiol or alkenylthiol with a carbon number of 4 to 20, and phosphines having a hydrocarbon group with a carbon number of 4 to 20, in particular, alkylphosphine or alkenylphosphine with a carbon number of 4 to 20. An organic solvent containing at least one selected from the group consisting of these is preferable. The organic solvent may eventually surface-modify the resulting semiconductor nanoparticles. The organic solvent may be formed from two or more organic solvents in combination. In particular, a mixed solvent containing at least one selected from thiols having a hydrocarbon group with a carbon number of 4 to 20, and at least one selected from amines having a hydrocarbon group with a carbon number of 4 to 20 in combination may be used. These organic solvents may also be mixed with other organic solvents. The organic solvent when containing the thiol and the amine may have a volume ratio of the thiol to the amine (thiol/amine) of, for example, greater than 0 to 1, and preferably 0.007 to 0.2.

The mixture may have a ratio of the number of Ag atoms to the total number of In and Ga atoms (Ag/(In+Ga)) in the composition of, for example, above 0.43 to 2.5 or less, preferably 0.5 to 1.0, and more preferably 0.6 to 0.8. Also, the mixture may have a ratio of the number of In atoms to the total number of In and Ga atoms (In/(In+Ga)) in the composition of, for example, 0.1 to 1.0, and preferably 0.25 to 0.99. Further, the mixture may have a ratio of the number of Ag atoms to the total number of Se atoms (Ag/Se) in the composition of, for example, 0.27 to 1.0, and preferably 0.35 to 0.5. The supply sources of the elements thus prepared to have a composition of the mixture satisfying these conditions can produce the semiconductor nanoparticles that easily exhibit band edge emission.

The heat-treating step may include heat treating the mixture at a first temperature in the range of above 200° C. to 370° C. For example, when the mixture contains a salt of Ag, a salt of In, and an Se supply source, the first temperature in the heat-treating may be preferably 220° C. or more, and more preferably 250° C. or more, and preferably less than 370° C., and more preferably 350° C. or less. Also, for example, when the mixture contains a salt of Ag, a salt of In, a salt of Ga, and an Se supply source, the first temperature in the heat-treating may be preferably 270° C. or more, and more preferably 300° C. or more, and preferably less than 370° C., and more preferably 350° C. or less. Also, when, for example, the mixture contains a salt of Ag, a salt of In, a salt of Ga, an Se supply source, and an S supply source, the first temperature may be preferably 270° C. or more, and more preferably 280° C. or more, still more preferably 300° C. or more, and preferably less than 370° C., more preferably 350° C. or less, still more preferably 320° C. or less. The duration of the heat-treating at the first temperature may be, for example, 1 min or more, and preferably 5 min or more, and more preferably 8 min or more, and still more preferably 10 min or more. Also, the duration of the heat-treating at the first temperature may be, for example, 180 min or less, preferably 120 min or less, and more preferably 60 min or less. The duration of the heat-treating at the first temperature may be, for example, 20 min or less.

The duration of the heat-treating starts when the temperature reaches a predetermined temperature, and ends when an operation of increasing or decreasing the temperature is carried out. The rate of temperature rise until the temperature reaches a predetermined temperature may be, for example, 1° C./min to 100° C./min, or 1° C./min to 50° C./min. The rate of temperature decrease after the heat-treating may be, for example, 1° C./min to 100° C./min. The temperature decrease may be carried out by cooling the mixture as appropriate, or by turning off the heat source and just allowing the mixture to cool.

The heat-treating step may include heat-treating the mixture at a second temperature in the range of 30° C. to 190° C. before heat-treating the mixture at the first temperature. In other words, the heat-treating step may include two heat-treating steps of heat-treating the mixture at a second temperature in the range of 30° C. to 190° C. (also referred to as "first heat-treating step") and then heat treating the mixture, which has been heat-treated at the second temperature, at the first temperature in the range of above 200° C. to 370° C. (also referred to as "second heat-treating step"). The two-step heat-treating may enable semiconductor nanoparticles with relatively high band edge emission intensity to be produced in a reproducible manner. The heat-treating at the second temperature and the heat-treating at the first temperature may be continuously carried out, or, the first heat-treating step is carried out at the second temperature, then the temperature may be increased to the first temperature before the second heat-treating step is carried out.

The second temperature may be preferably 30° C. or more, and more preferably 100° C. or more. Also, the second temperature may be preferably 200° C. or less, and more preferably 180° C. or less. The duration of the heat-treating at the second temperature may be, for example, 1 min or more, and preferably 5 min or more, and more preferably 10 min or more. Also, the duration of the heat-treating at the second temperature may be, for example, 120 min or less, preferably 60 min or less, and more preferably 30 min or less.

The heat-treating step may be preferably carried out, for example, in a rare gas atmosphere, such as argon, or in an inert atmosphere, such as nitrogen atmosphere. Heat-treating in an inert atmosphere may reduce oxide by-products and surface oxidation of the resulting semiconductor nanoparticles.

The semiconductor nanoparticles obtained through the heat-treating step may be separated from the organic solvent, and may be further purified as appropriate. The semiconductor nanoparticles may be separated, after completion of the heat-treating step, for example, through centrifugation of the organic solvent containing the semiconductor nanoparticles, and removal of the supernatant liquid containing the semiconductor nanoparticles. Purification of the semiconductor nanoparticles may include, for example, adding an organic solvent, such as alcohol, to the supernatant liquid, centrifuging the mixture, and collecting the semiconductor nanoparticles as precipitate. The precipitate itself may be collected, or the supernatant liquid may be removed to collect the precipitate. The collected precipitate may be dried, for example, by vacuum drying, or natural drying, or a combination of both. Natural drying may be carried out, for example, by leaving the precipitate at normal temperature and pressure in an atmospheric air, and in that case, the precipitate may be left for 20 hours or more, for example, about 30 hours.

The collected precipitate may be dispersed in an organic solvent. The purification process including addition of alcohol and centrifugation may be repeated multiple times as appropriate. The alcohol to be used for purification may be a lower alcohol, such as methanol, ethanol, or propanol. When the precipitate is dispersed in an organic solvent, a halogen solvent, such as chloroform, or a hydrocarbon solvent, such as toluene, cyclohexane, hexane, pentane, or octane, may be used as the organic solvent.

Light-Emitting Device

The light-emitting device may include a light conversion member containing the semiconductor nanoparticles described above and a semiconductor light-emitting element. In the light emitting device, for example, the semiconductor nanoparticles partially absorb light from the semiconductor light-emitting element, and emit light with a longer wavelength. Thus, the light from the semiconductor nanoparticles and the residual emission from the semiconductor light-emitting element are mixed, and the mixed light is utilized as emission from the light-emitting device.

More specifically, a semiconductor light-emitting element that emits bluish-violet light or blue light with a peak wavelength of about 400 nm to 490 nm and the semiconductor nanoparticles that absorb blue light and emit yellow light may be used in combination to produce a light emitting device that emits white light. A light emitting device that emits white light may also be produced by using two types of the semiconductor nanoparticles: semiconductor nanoparticles that absorb blue light and emit green light, and semiconductor nanoparticles that absorb blue light and emit red light.

A light emitting device that emits white light may also be produced by using a semiconductor light-emitting element that emits ultraviolet rays with a peak wavelength of 400 nm or less together with the three types of semiconductor nanoparticles that absorb ultraviolet rays, and respectively emit blue, green, and red light. In this case, light from the light-emitting element is preferably all absorbed by the semiconductor nanoparticles to prevent ultraviolet rays emitted from the light-emitting element from leaking outside.

A light emitting device that emits white light may also be produced by using a semiconductor light-emitting element that emits blue-green light with a peak wavelength of about 490 nm to 510 nm, and the above-described semiconductor nanoparticles that absorb blue-green light and emit red light.

A light emitting device that emits near infrared rays may be produced by using a semiconductor light-emitting element that emits red light with a wavelength of 700 nm to 780 nm, and the semiconductor nanoparticles that absorb red light and emit near infrared rays.

The semiconductor nanoparticles may be used in combination with other semiconductor quantum dots, or other fluorescent materials that are non-quantum dots (e.g., organic or inorganic fluorescent material). Examples of the other semiconductor quantum dots include binary system semiconductor quantum dots described in the Description of the Related Art. Examples of the non-quantum dot fluorescent materials include garnet fluorescent materials, such as aluminium garnet. Examples of the garnet fluorescent materials include cerium-activated yttrium aluminium garnet fluorescent materials and cerium-activated lutetium aluminium garnet fluorescent materials. In addition to these, europium and/or chromium-activated nitrogen-containing calcium aluminosilicate fluorescent material, europium-activated silicate fluorescent materials, β-SiAlON fluorescent materials, nitride fluorescent materials, such as CASN or SCASN, rare-earth nitride fluorescent materials, such as $LnSi_3N_{11}$ or LnSiAlON, or oxynitride fluorescent materials, such as $BaSi_2O_2N_2$:Eu or $Ba_3Si_6O_{12}N_2$:Eu, sulfide fluorescent materials, such as CaS, $SrGa_2S_4$, $SrAl_2O_4$, or ZnS, chlorosilicate fluorescent materials, $SrLiAl_3N_4$:Eu fluorescent materials, $SrMg_3SiN_4$:Eu fluorescent materials, or $K_2SiF_6$:Mn fluorescent materials as a manganese-activated fluoride complex fluorescent material may be used.

In the light emitting device, the light conversion member containing the semiconductor nanoparticles may be, for example, a sheet or plate-like member, or a 3-dimensional member. An example of the 3-dimensional member may be a sealing member formed in a recess in a surface mount light emitting diode package to seal a semiconductor light-emitting element arranged in the bottom of the recess by filling resin into the recess.

In the case where the semiconductor light-emitting element is arranged on a planar substrate, the light conversion member may be a resin member formed in a manner to surround the top and side surfaces of the semiconductor light-emitting element with a substantially uniform thickness. In the case where a resin member containing a reflective material is filled around a semiconductor light-emitting element such that the top end of the resin material aligns with the top end of the light conversion member to form a same plate, the light conversion member may be a resin member with a predetermined thickness and formed like a flat plate on the semiconductor light-emitting element and the resin member containing the reflective material around the light-emitting element.

The light conversion member may be in contact with the semiconductor light-emitting element, or arranged apart from the semiconductor light-emitting element. More specifically, the light conversion member may be a pellet member, a sheet member, a plate-like member, or a rod-like member arranged apart from the semiconductor light-emitting element, or, for example, a sealing member, a coating member (a member separately formed from a mold member and covering the light-emitting element) or a mold member (including, for example, a lens-like member) arranged in contact with the semiconductor light-emitting element.

In the light-emitting device when containing two or more semiconductor nanoparticles with different wavelength emission, the two or more semiconductor nanoparticles may be mixed in a single light conversion member, or two or more light conversion member each containing single type quantum dots may be used in combination. In this case, the two or more light conversion members may form a layered structure, or may be arranged on a flat-plate in a dot or stripe pattern.

An example of the semiconductor light-emitting element is an LED chip. An LED chip may include two or more semiconductor layers selected from, for example, GaN, GaAs, InGaN, AlInGaP, GaP, SiC, and ZnO. The semiconductor light-emitting element that emits bluish-violet light, blue light, or ultraviolet rays contains a GaN compound semiconductor layer having a composition represented by, for example, $In_XAl_YGa_{1-X-Y}N$ (where 0≤X, 0≤Y, and X+Y<1).

The light-emitting device may be suitably incorporated into a liquid crystal display as a light source. The band edge emission by the semiconductor nanoparticles may have a short emission lifetime. Thus, a light emitting device containing the semiconductor nanoparticles may be suitable as a light source for a liquid crystal display that needs a relatively quick response rate. The semiconductor nanoparticles according to the present embodiment may have an emission peak with a small half bandwidth energy as a band edge emission. Thus, without using a thick-color filter, a liquid crystal display with good color reproducibility can be obtained by including a light emitting device that includes:

a blue semiconductor light-emitting element that emits blue light with a peak wavelength in the range of 420 nm to 490 nm, the semiconductor nanoparticles that emit green light with a peak wavelength in the range of 510 nm to 550 nm, and preferably in the range of 530 nm to 540 nm, and the semiconductor nanoparticles that emit red light with a peak wavelength in the range of 600 nm to 680 nm, and preferably 630 nm to 650 nm; or, a semiconductor light-emitting element that emits an ultraviolet light with a peak wavelength of 400 nm or less, and the semiconductor nanoparticles that emit blue light with a peak wavelength in the range of 430 nm to 470 nm, and preferably 440 nm to 460 nm, the semiconductor nanoparticles that emit green light with a peak wavelength in the range of 510 nm to 550 nm, and preferably 530 nm to 540 nm, and the semiconductor nanoparticles that emit red light with a peak wavelength in the range of 600 nm to 680 nm, and preferably 630 nm to 650 nm.

The light emitting device may be used, for example, as a direct back light, or an edge backlight.

A light conversion member containing the semiconductor nanoparticles may be incorporated into a liquid crystal display in the form of a resin or glass sheet, a plate, or a rod independent of a light emitting device.

EXAMPLES

The present invention will now be described specifically with reference to Examples; however, the present invention is not limited to these Examples.

Example 1

0.10 mmol of silver acetate (AgOAc), 0.15 mmol of acetylacetonate indium ($In(CH_3COCHCOCH_3)_3$;$In(acac)_3$), and 0.25 mmol of selenourea as a selenium source were discharged and dispersed into a mixed solution of 0.1 $cm^3$ of 1-dodecanethiol and 2.9 $cm^3$ of oleylamine. The dispersion was then put into a test tube together with a stirrer, and the test tube was purged with nitrogen. The contents in the test tube were then subjected to the first heat-treating step at 150° C. for 10 min, and then the second heat-treating step at 250° C. for 10 min in the nitrogen atmosphere while being stirred. After the heat-treatments, the resultant suspension was allowed to cool, and then centrifuged (radius 146 mm, 4000 rpm, 5 min) to collect the supernatant or the dispersion. To this, methanol was added until semiconductor nanoparticles started to precipitate, and the mixture was centrifuged (radius 146 mm, 4000 rpm, 5 min) to allow the semiconductor nanoparticles to precipitate. The precipitate was collected and dispersed in chloroform to obtain a semiconductor nanoparticle dispersion. Table 1 shows the initial composition of the raw materials.

Examples 2, 3, and 4, Comparative Example 1

A semiconductor nanoparticle dispersion was obtained in each of Examples 2, 3, and 4 and Comparative Example 1 in the same manner as Example 1 except that the initial composition of the raw materials was changed as shown in Table 1.

TABLE 1

| | AgOAc (mmol) | In(acac))$_3$ (mmol) | $(NH_2)_2CSe$ (mmol) | Ag/In |
|---|---|---|---|---|
| Comparative Example 1 | 0.064 | 0.15 | 0.23 | 0.43 |
| Example 1 | 0.10 | 0.15 | 0.25 | 0.67 |
| Example 2 | 0.15 | 0.15 | 0.28 | 1.00 |
| Example 3 | 0.23 | 0.15 | 0.31 | 1.50 |
| Example 4 | 0.35 | 0.15 | 0.36 | 2.33 |

Example 5

0.10 mmol of silver acetate (AgOAc), 0.11 mmol of acetylacetonate indium ($In(CH_3COCHCOCH_3)_3$;$In(acac)_3$), 0.038 mmol of acetylacetonate gallium ($Ga(CH_3COCHCOCH_3)_3$;$Ga(acac)_3$), and 0.25 mmol of selenourea as a selenium source were discharged and dispersed into a mixed solution of 0.1 $cm^3$ of 1-dodecanethiol and 0.29 $cm^3$ of oleylamine. The dispersion was put into a test tube together with a stirrer, and the test tube was purged with nitrogen. The contents in the test tube were subjected to the first heat-treating step at 150° C. for 10 min, and then the second heat-treating step at 300° C. for 10 min in the nitrogen atmosphere while being stirred. After the heat-treatments, the resultant suspension was allowed to cool, and then centrifuged (radius 146 mm, 4000 rpm, 5 min) to collect the supernatant or the dispersion. To this, methanol was added until semiconductor nanoparticles started to precipitate, and the mixture was centrifuged (radius 146 mm, 4000 rpm, 5 min) to allow the semiconductor nanoparticles to precipitate. The precipitate was collected and dispersed in chloroform to obtain a semiconductor nanoparticle dispersion. Table 2 shows the initial composition of the raw materials.

Examples 6 to 8, Comparative Examples 2 and 3

A semiconductor nanoparticle dispersion was each obtained in the same manner as Example 1 except that the initial composition of the raw materials and the heat-treating temperature (first temperature) in the second heat-treating step were changed as shown in Table 2.

TABLE 2

| | Second step heat-treating temperature (° C.) | AgOAc (mmol) | $In(acac)_3$ (mmol) | $Ga(acac)_3$ (mmol) | $(NH_2)_2CSe$ (mmol) | Ag/ (In + Ga) | In/ (In + Ga) |
|---|---|---|---|---|---|---|---|
| Example 5 | 300 | 0.10 | 0.11 | 0.038 | 0.25 | 0.67 | 0.75 |
| Example 6 | 350 | 0.10 | 0.11 | 0.038 | 0.25 | 0.67 | 0.75 |
| Example 7 | 300 | 0.10 | 0.75 | 0.75 | 0.25 | 0.07 | 0.50 |
| Example 8 | 300 | 0.10 | 0.038 | 0.11 | 0.25 | 0.67 | 0.25 |
| Comparative Example 2 | 150 | 0.10 | 0.11 | 0.038 | 0.25 | 0.67 | 0.75 |
| Comparative Example 3 | 200 | 0.10 | 0.11 | 0.038 | 0.25 | 0.67 | 0.75 |

Average Particle Diameter

The shapes of the resultant respective semiconductor nanoparticles were observed using a transmission electron microscope (TEM: H-7650 by Hitachi), and the average particle diameters were measured using 80,000 to 200,000×-magnified TEM images. As a TEM grid, High Resolution Carbon: HRC-C10 STEM Cu100P grid (by Okenshoji) was used. The resultant particles were spherical or polygonal. The average particle diameters were obtained by choosing TEM images of at least three different sites, measuring and averaging the particle diameters of all the countable nanoparticles among the nanoparticles contained in these sites (i.e., excluding partially cut-out particles along the edges of the images). In all Examples including the present Example and Comparative Examples, the particle diameters of at least 100 nanoparticles in total were measured using three or more TEM images. Table 3 shows their average particle diameters.

Light-Emitting Property

Figure 2:
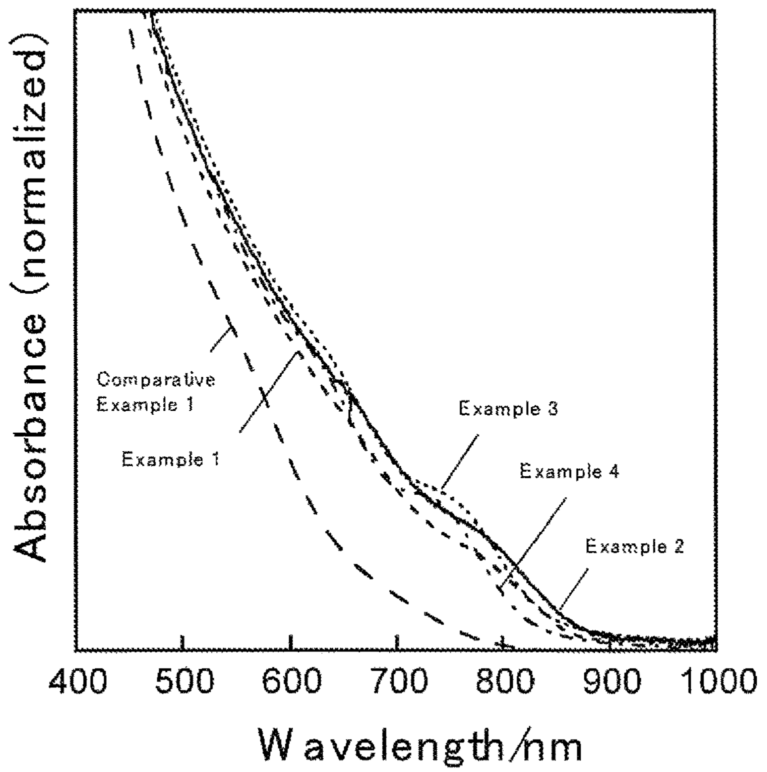
FIG. 2 is a graph showing absorption spectra of semiconductor nanoparticles according to examples and a comparative example described in the present disclosure.
Figure 3:
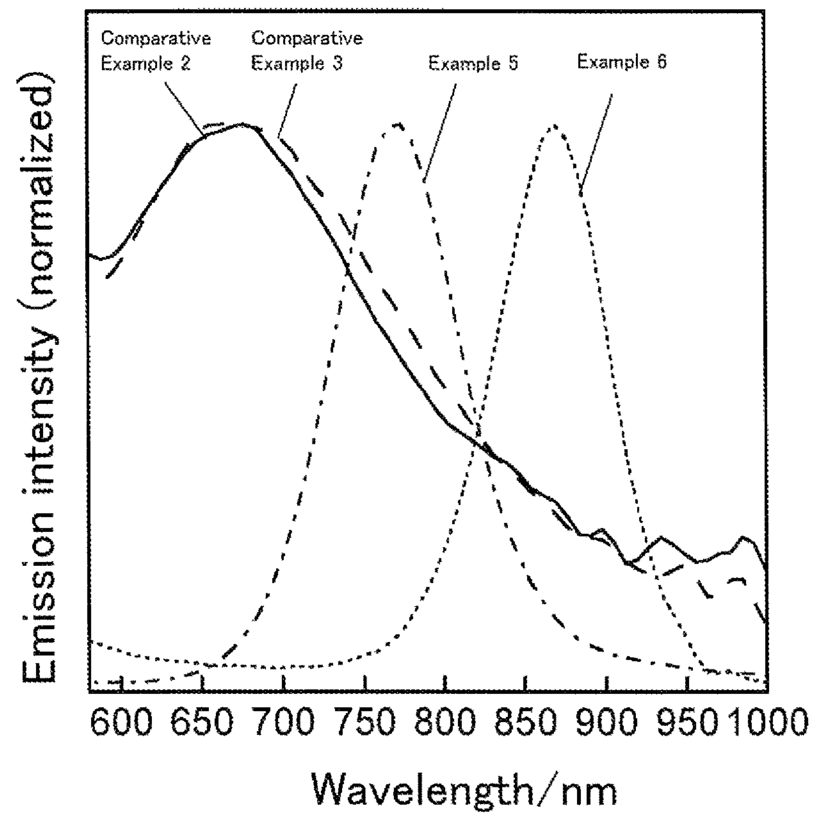
FIG. 3 is a graph showing emission spectra of semiconductor nanoparticles according to examples and comparative examples described in the present disclosure.
Figure 4:
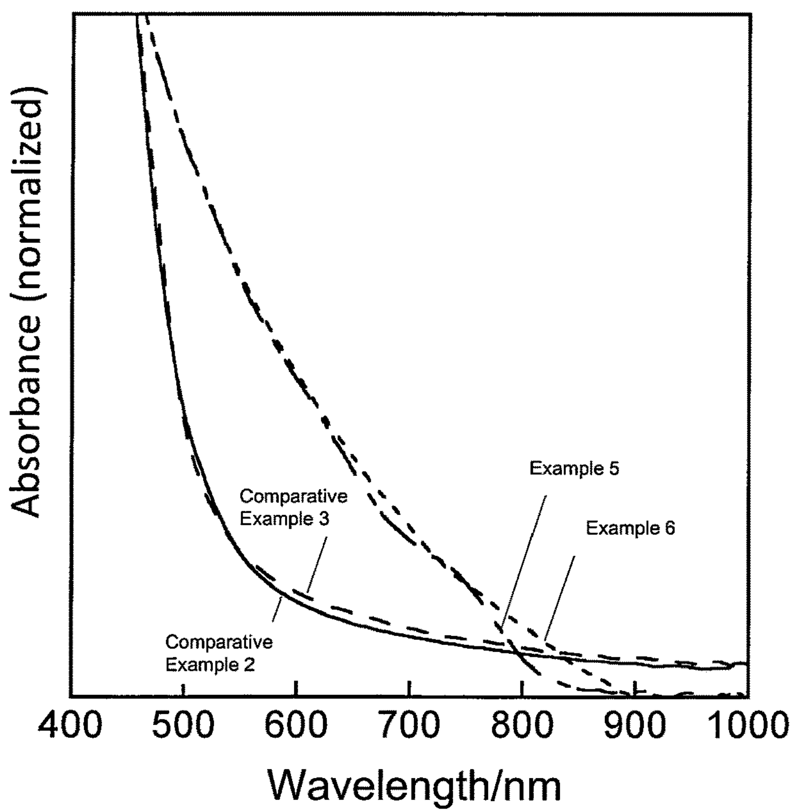
FIG. 4 is a graph showing absorption spectra of semiconductor nanoparticles according to examples and comparative examples described in the present disclosure.
Figure 5:
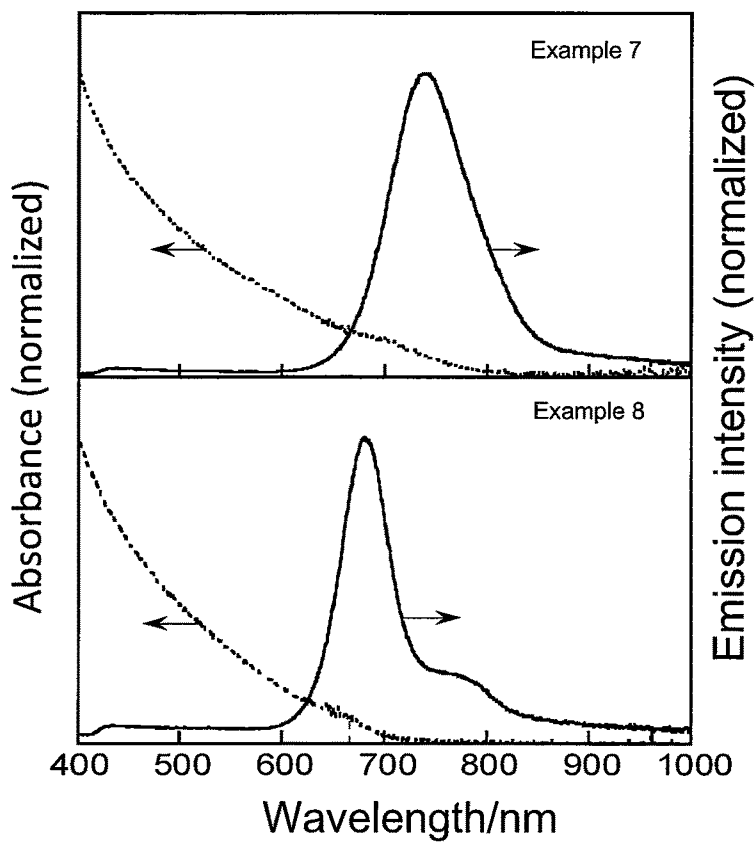
FIG. 5 is a graph showing emission spectra and absorption spectra of semiconductor nanoparticles according to examples described in the present disclosure.

For the respective semiconductor nanoparticles, the absorption spectrum and the emission spectrum were measured. The absorption spectrum in the wavelength range of 190 nm to 1100 nm was measured using a diode array spectrophotometer (Agilent 8453A by Agilent Technologies). The emission spectrum was measured at an excitation wavelength of 365 nm using a multichannel photodetector (PMA11 by Hamamatsu Photonics). FIG. 1 shows the emission spectra of Examples 1 to 4, and Comparative Example 1, and FIG. 2 shows their absorption spectra. FIG. 3 shows the emission spectra of Examples 5 and 6 and Comparative Examples 2 and 3, and FIG. 4 shows their absorption spectra. FIG. 5 shows the absorption spectra and emission spectra of Examples 7 and 8. Table 3 shows the peak emission wavelength of the steep emission peak observed in each emission spectrum (band edge emission), half bandwidth, emission quantum yield, and stokes shift (a value obtained by subtracting the peak emission energy value in each emission spectrum from the peak absorption energy value in the corresponding absorption spectrum).

X-Ray Diffraction Pattern

Figure 6:
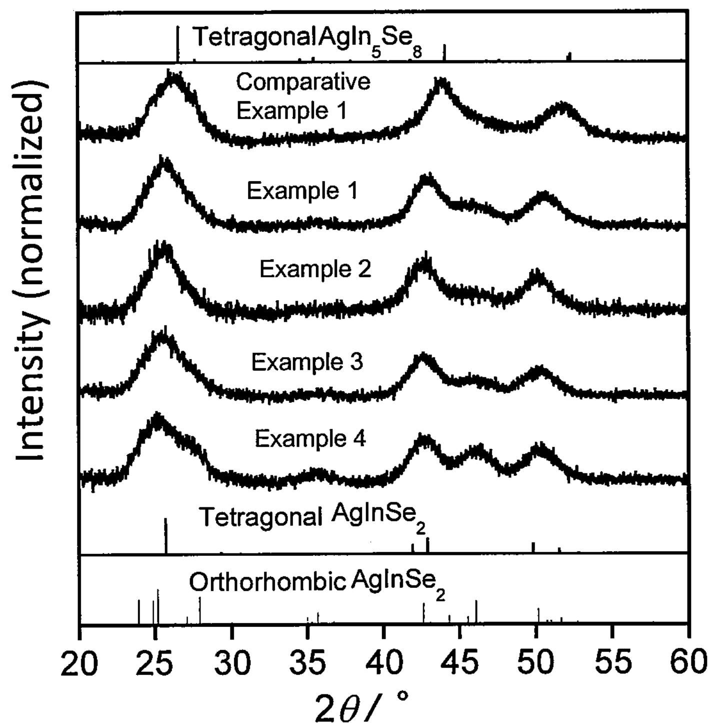
FIG. 6 is a graph showing X-ray diffraction patterns of semiconductor nanoparticles according to examples and a comparative example described in the present disclosure.
Figure 7:
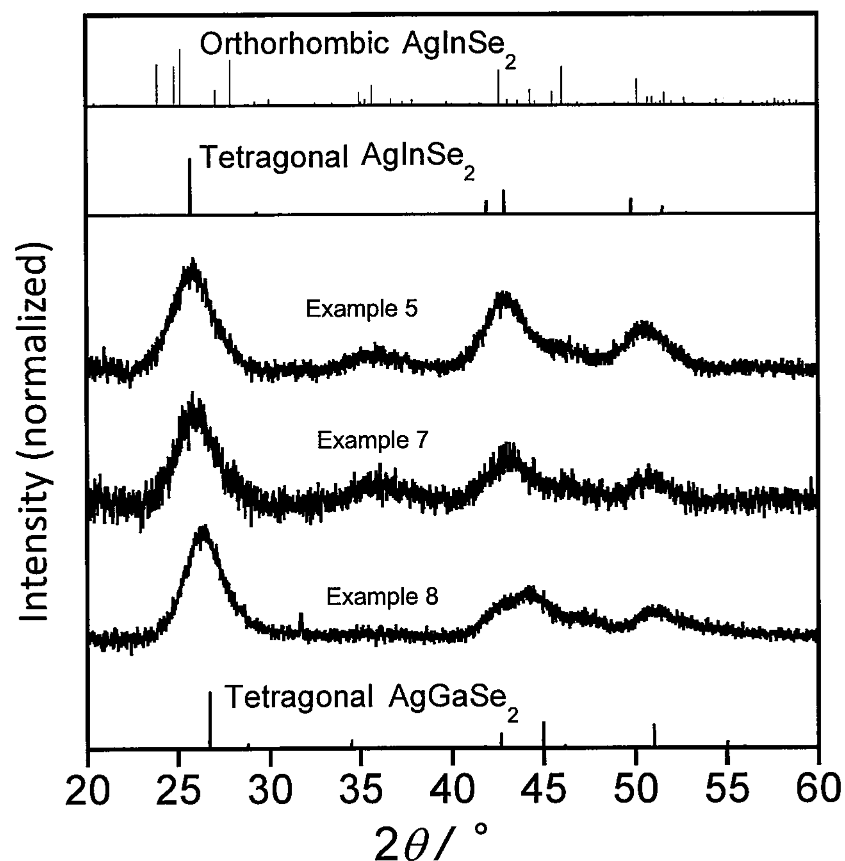
FIG. 7 is a graph showing X-ray diffraction patterns of semiconductor nanoparticles according to examples described in the present disclosure.

For the respective semiconductor nanoparticles obtained in Examples 1 to 4 and Comparative Example 1, the X-ray diffraction (XRD) patterns were measured and compared with tetragonal (chalcopyrite) $AgInSe_2$ and orthorhombic $AgInSe_2$. FIG. 6 shows their XRD patterns. For the respective semiconductor nanoparticles obtained in Examples 5, 7, and 8, the X-ray diffraction (XRD) patterns were measured, and compared with tetragonal (chalcopyrite) $AgInSe_2$ and $AgGaSe_2$, and with orthorhombic $AgInSe_2$. FIG. 7 shows their XRD patterns. The XRD patterns were measured using a powder X-ray diffractometer (SmartLab by Rigaku).

TABLE 3

| | Peak emission wavelength (nm) | Emission quantum yield (%) | Half bandwidth (meV) | Stokes shift (meV) | Average particle diameter (nm) | Crystal system |
|---|---|---|---|---|---|---|
| Comparative Example 1 | 660 | 1.7 | 520 (defect emission) | — | 3.1 | tetragonal $AgIn_5Se_8$ |
| Example 1 | 817 | 13.7 | 175 | 72 | 4.2 | tetragonal |
| Example 2 | 823 | 2.2 | 200 | 64 | 4.1 | tetragonal |
| Example 3 | 794 | 1.2 | 175 | 65 | 3.5 | tetragonal |
| Example 4 | 785 | 3.4 | 160 | 90 | 3.6 | tetragonal and orthorhombic |
| Comparative Example 2 | 665 | 0.7 | 600 (defect emission) | — | 2.2 | — |
| Comparative Example 3 | 680 | 1.0 | 660 (defect emission) | — | 2.9 | — |
| Example 5 | 770 | 5.5 | 200 | 43 | 3.8 | — |
| Example 6 | 870 | 2.1 | 130 | 75 | 8.1 | — |
| Example 1 | 817 | 13.7 | 175 | 72 | 4.2 | — |
| Example 5 | 770 | 5.5 | 200 | 43 | 3.8 | tetragonal |
| Example 7 | 740 | 2.2 | 210 | 49 | 3.9 | tetragonal |
| Example 8 | 680 | 1.4 | 150 | 38 | 3.9 | mainly tetragonal and partially orthorhombic |

The semiconductor nanoparticles obtained in Examples 1 to 4, which contained Ag, In, and Se in an initial ratio of Ag to In of above 0.43 at the time of synthesis, and was subjected to the second heat-treating step at a first temperature of 250° C., exhibited a band edge emission with a half bandwidth of 250 meV or less. In contrast, the semiconductor nanoparticles of Comparative Example 1, which had an initial ratio of Ag to In of not greater than 0.43, exhibited no band edge emission, and showed defect emission over a wide range.

The semiconductor nanoparticles of Examples 5 and 6, which contained Ag, In, Ga, and Se in an initial ratio of Ag to In and Ga of above 0.43 at the time of synthesis, and was subjected to the second heat-treating at a first temperature of above 200° C. exhibited a band edge emission with a half bandwidth of 250 meV or less. In contrast, the semiconductor nanoparticles of Comparative Examples 2 and 3, which were subjected to the second heat-treating at a first temperature of 200° C. or less, exhibited no band edge emission, and showed defect emission over a wide range.

The semiconductor nanoparticles containing Ag, In, Ga, and Se with a smaller initial ratio of In to In and Ga exhibited a band edge emission with a peak emission wavelength at shorter wavelengths.

Examples 9 and 10

Silver acetate (AgOAc), lithium acetate (LiOAc), indium acetate ($In(OAc)_3$), and selenourea ($(NH_2)_2CSe$) were placed in a test tube as shown in Table 4. To this, 0.1 $cm^3$ of 1-dodecanethiol and 2.9 $cm^3$ of oleylamine were added as a solvent. To each test tube, a stirrer was put in, and each test tube was purged with nitrogen. The contents in each test tube were subjected to the first heat-treating at 150° C. for 10 min and the second heat-treating at 300° C. for 10 min while being stirred in the nitrogen atmosphere. After the heat-treatments, the resultant suspension was allowed to cool, and the mixture was centrifuged (radius 146 mm, 4000 rpm, 5 min) to separate the supernatant from the precipitate. The supernatant and the precipitate were each washed with 3 mL of methanol and 3 mL of ethanol, and the supernatant was again centrifuged (radius 146 mm, 4000 rpm, 5 min) to allow the semiconductor nanoparticles to precipitate. The precipitate was collected and dispersed in chloroform to obtain a semiconductor nanoparticle dispersion.

TABLE 4

| | AgOAc (mmol) | LiOAc (mmol) | $In(OAc)_3$ (mmol) | $(NH_2)_2CSe$ (mmol) | Ag/In | Li/(Ag + Li) |
|---|---|---|---|---|---|---|
| Example 9 | 0.10 | 0.00 | 0.10 | 0.20 | 1.00 | 0.0 |
| Example 10 | 0.07 | 0.03 | 0.10 | 0.20 | 0.70 | 0.3 |

Figure 8:
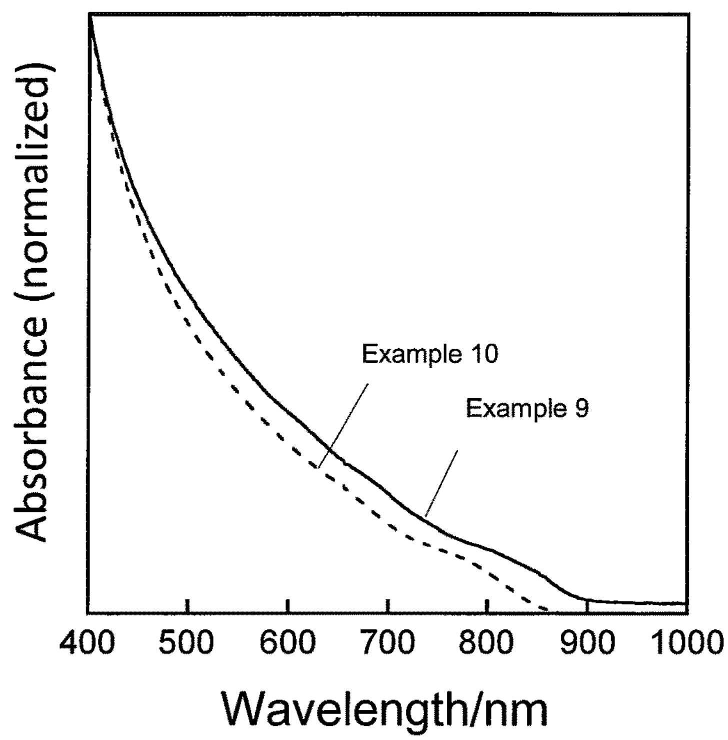
FIG. 8 is a graph showing absorption spectra of semiconductor nanoparticles according to examples described in the present disclosure.
Figure 9:
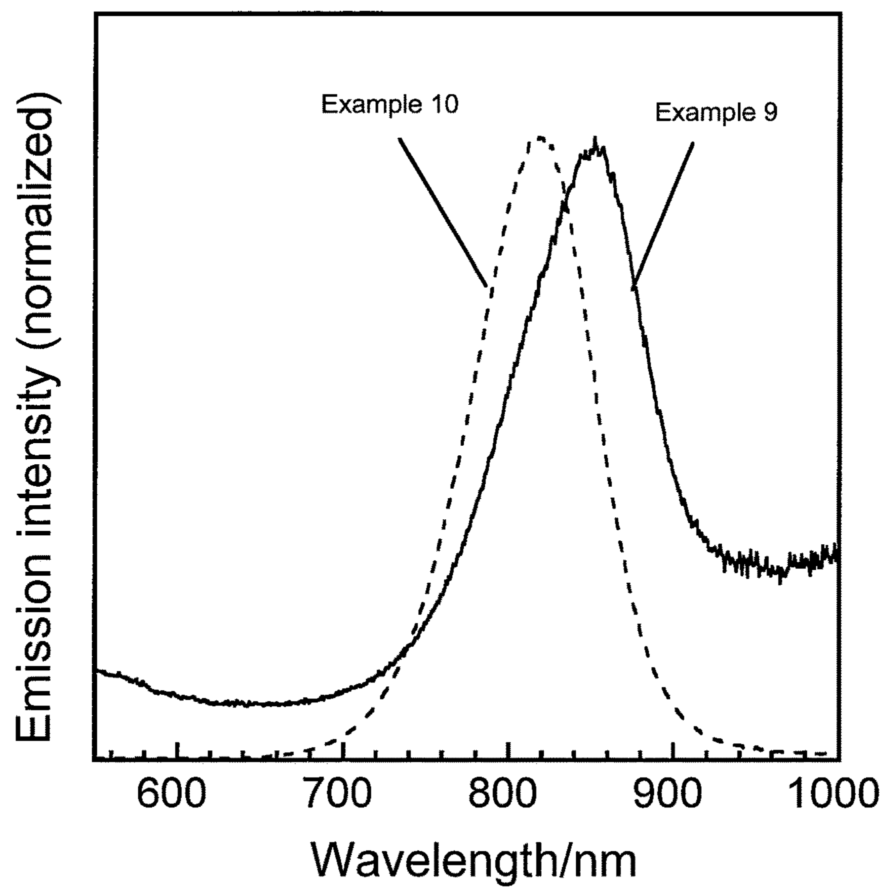
FIG. 9 is a graph showing emission spectra of semiconductor nanoparticles according to examples described in the present disclosure.
Figure 10:
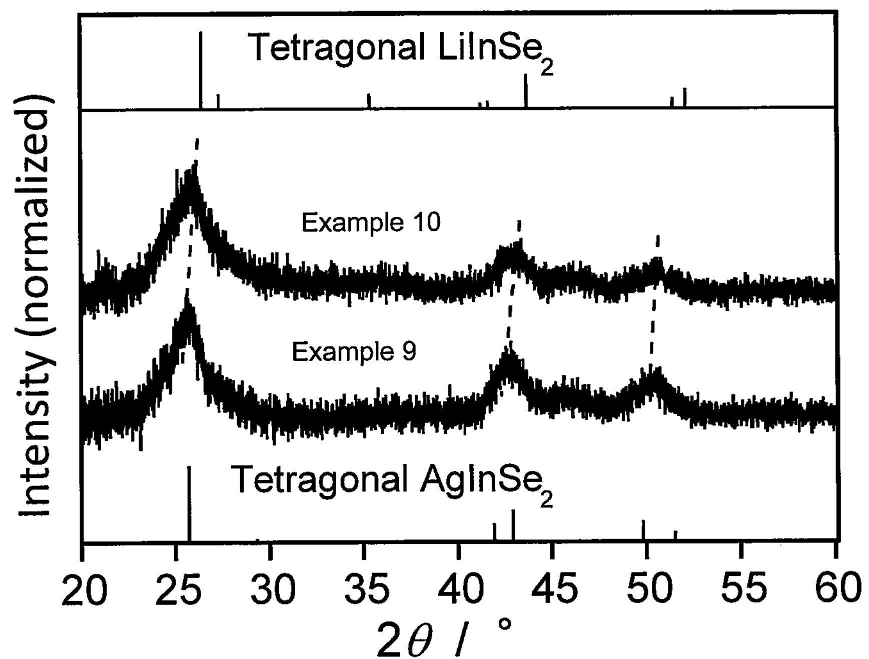
FIG. 10 is a graph showing X-ray diffraction patterns of semiconductor nanoparticles according to examples described in the present disclosure.

For the respective semiconductor nanoparticles, the average particle diameter, emission properties, and X-ray diffraction (XRD) pattern were measured in the same manner as described above. Table 5 shows the results. FIG. 8 shows their absorption spectra normalized at 400 nm, FIG. 9 shows their emission spectra (excitation light at 365 nm), and FIG. 10 shows their XRD patterns.

TABLE 5

| | Peak emission wavelength (nm) | Emission quantum yield (%) | Half bandwidth (meV) | Stokes shift (meV) | Average particle diameter (nm) | Crystal system |
|---|---|---|---|---|---|---|
| Example 9 | 852 | 0.5 | 203 | 33 | 5.8 | tetragonal |
| Example 10 | 820 | 14.9 | 164 | 84 | 4.1 | tetragonal |

The absorption spectra in FIG. 8 show that the absorption edge wavelength appears at shorter wavelengths with a greater initial Li ratio (Li/(Ag+Li)). Thus, the alkali metal (Li) and Ag have seemingly been solid-solubilized. FIG. 9 shows the emission spectrum of Example 10 with no peak appearing around 1000 nm, or seemingly exhibiting no defect emission. The XRD patterns of FIG. 10 show that the peak appears on the higher-angle side when the semiconductor nanoparticles have a greater initial Li ratio. Thus, the alkali metal (Li) and Ag have seemingly been solid-solubilized.

Examples 11 to 13

Silver acetate (AgOAc), acetylacetonate indium (In$(acac)_3$), acetylacetonate gallium (Ga$(acac)_3$), powdered sulfur (S), and selenourea ($(NH_2)_2CSe$) were weighed into test tubes as shown in Table 6. To each test tube, 2.75 mL of oleylamine, and 0.25 mL of 1-dodecanethiol were added, and each test tube was purged with nitrogen. The mixture in each test tube was heated while being stirred at 300° C. for 10 min, and was allowed to cool to room temperature. The contents were then centrifuged (4000 rpm, 5 min), and the supernatant was filtered through a 20 μm mesh membrane filter. To this, methanol was added until semiconductor nanoparticles started to precipitate, and the mixture was centrifuged (radius 146 mm, 4000 rpm, 5 min) to allow the semiconductor nanoparticles to precipitate. The precipitate was collected and dispersed in chloroform to obtain a semiconductor nanoparticle dispersion.

TABLE 6

| | AgOAc (mmol) | In(acac)$_3$ (mmol) | Ga(acac)$_3$ (mmol) | S (mmol) | $(NH_2)_2CSe$ (mmol) | Ag/ (In + Ga) | (S + Se) |
|---|---|---|---|---|---|---|---|
| Example 11 | 0.0833 | 0.05 | 0.075 | 0.1834 | 0.0458 | 0.67 | 0.8 |
| Example 12 | 0.0833 | 0.05 | 0.075 | 0.1490 | 0.0802 | 0.67 | 0.65 |
| Example 13 | 0.0833 | 0.05 | 0.075 | 0.0458 | 0.1834 | 0.67 | 0.2 |

Figure 11:
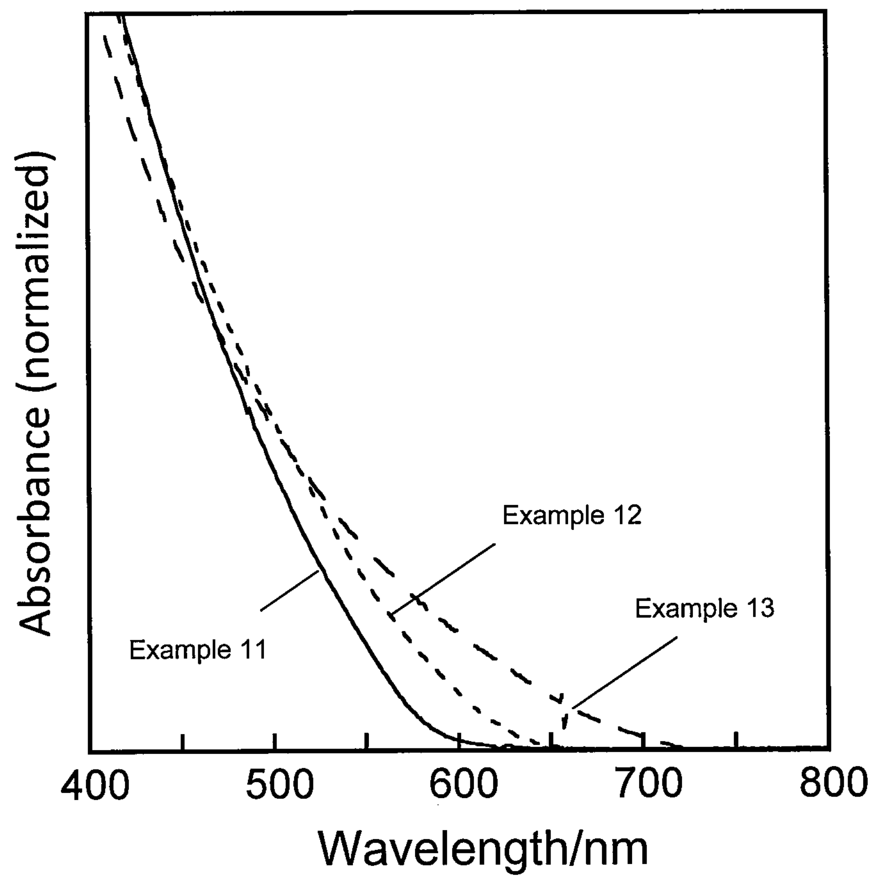
FIG. 11 is a graph showing absorption spectra of semiconductor nanoparticles according to examples described in the present disclosure.
Figure 12:
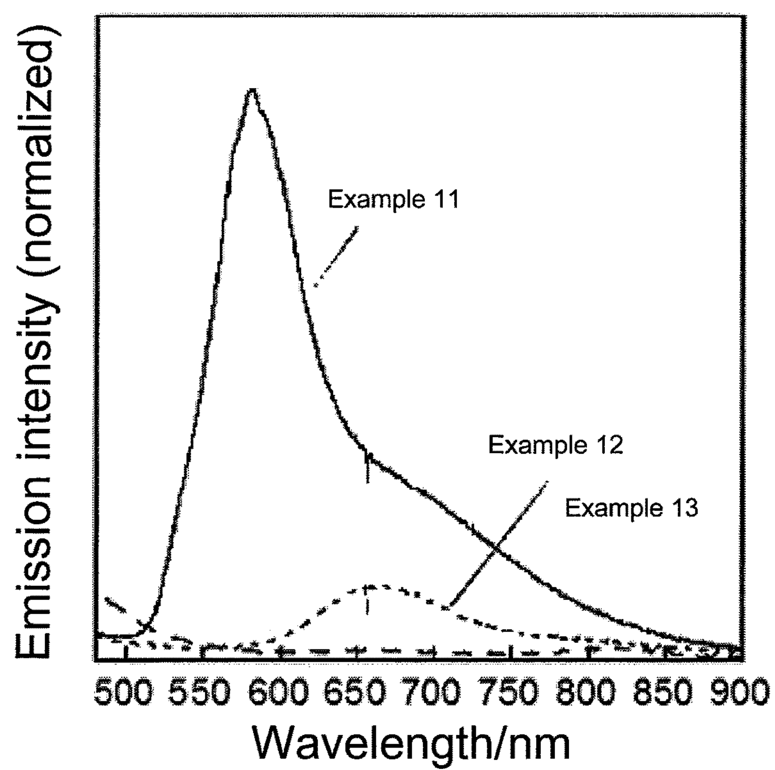
FIG. 12 is a graph showing emission spectra of semiconductor nanoparticles according to examples described in the present disclosure.

For the respective semiconductor nanoparticles, the average particle diameter and emission properties were measured in the same manner as described above. Table 7 shows the results. FIG. 11 shows their absorption spectra normalized at 365 nm, and FIG. 12 shows their emission spectra (with excitation light at 365 nm).

TABLE 7

| | Peak emission wavelength (nm) | Emission quantum yield (%) | Half bandwidth (meV) | Stokes shift (meV) | Average particle diameter (nm) | Crystal system |
|---|---|---|---|---|---|---|
| Example 11 | 580 | 2.9 | 170 | — | 3.6 | — |
| Example 12 | 644 | 1.0 | 250 | — | 4.5 | tetragonal |
| Example 13 | 808 | 1.0 | 250 | — | 6.9 | — |

Examples 14 to 16

$1.0\times10^{-5}$ mmol each of the semiconductor nanoparticles prepared in the same manner as Example 1, and the semiconductor nanoparticles obtained in Examples 11 and 12 were aliquoted, and the solvent was removed under reduced pressure. $5.33\times10^{-5}$ mmol of acetylacetonate gallium (Ga$(acac)_3$) and $5.33\times10^{-5}$ mmol of thiourea were weighed into each test tube. To this, 3.0 mL of oleylamine was added, and each test tube was purged with nitrogen. The contents were heated while being stirred at 300° C. for 15 min, and then allowed to cool to room temperature. This was centrifuged (4000 rpm, 5 min) to remove the precipitate. The supernatant was filtered through a 20 μm mesh membrane filter. To this, methanol was added and centrifuged (4000 rpm, 5 min). To the resultant precipitate, ethanol was added and centrifuged (4000 rpm, 5 min) to obtain core-shell semiconductor nanoparticles as precipitate. To the precipitate, chloroform was added to disperse the core-shell structured semiconductor nanoparticles.

Figure 13:
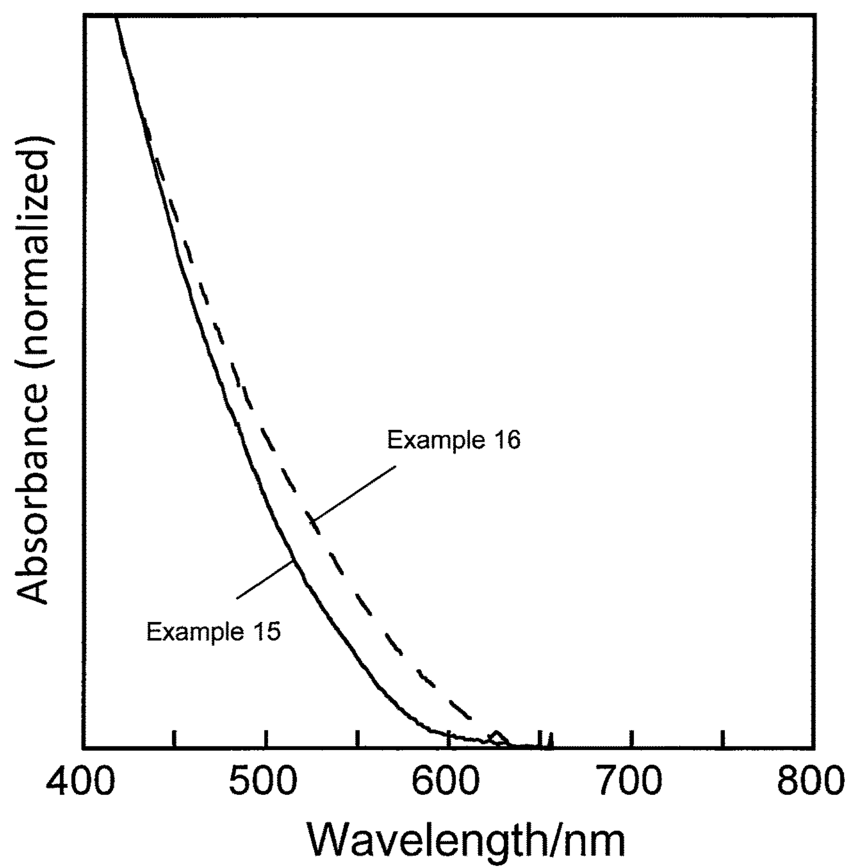
FIG. 13 is a graph showing absorption spectra of semiconductor nanoparticles according to examples described in the present disclosure.
Figure 14:
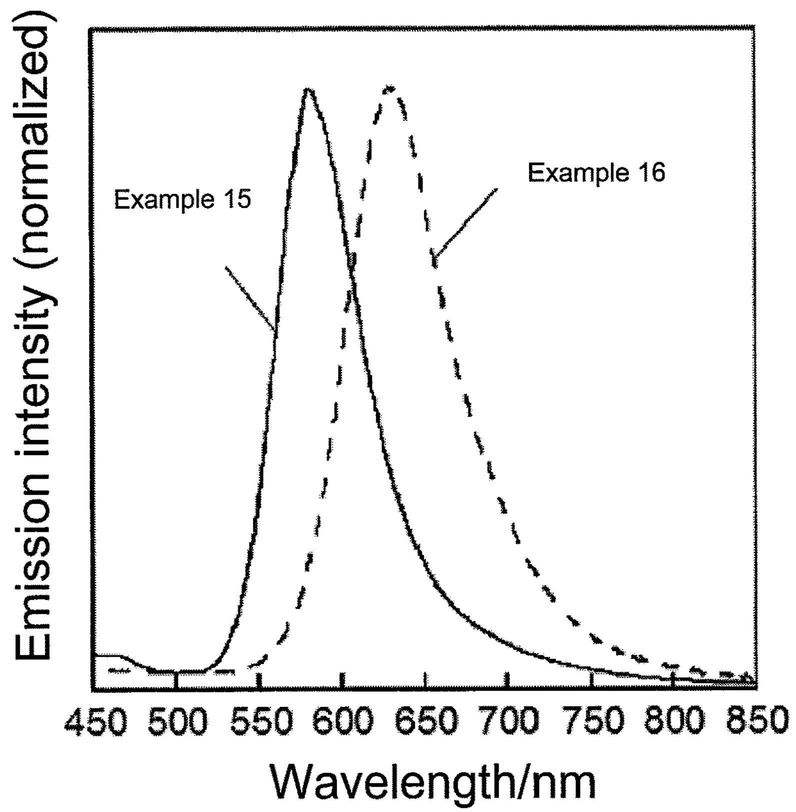
FIG. 14 is a graph showing emission spectra of semiconductor nanoparticles according to examples described in the present disclosure.

For the obtained semiconductor nanoparticles, the average particle diameter and emission properties were measured in the same manner as described above. Table 8 shows the results. For Examples 15 and 16, FIG. 13 shows absorption spectra normalized at 365 nm, and FIG. 14 shows their emission spectra (with excitation light at 365 nm).

TABLE 8

| | Peak emission wavelength (nm) | Emission quantum yield (%) | Half bandwidth (meV) | Stokes shift (meV) | Average particle diameter (nm) | Crystal system |
|---|---|---|---|---|---|---|
| Example 14 | 807 | 8.8 | 130 | 65 | 5.4 | — |
| Example 15 | 580 | 9.3 | 240 | — | 4.3 | — |
| Example 16 | 630 | 3.3 | 220 | — | 5.1 | tetragonal |

Examples 17 and 18

Silver acetate (AgOAc), acetylacetonate indium ($In(acac)_3$), acetylacetonate gallium ($Ga(acac)_3$), powdered sulfur (S), and selenourea ($(NH_2)_2CSe$) were weighed as shown in Table 9 into a test tube. To each test tube, 2.75 mL of oleylamine and 0.25 mL of 1-dodecanethiol were added, and each test tube was purged with nitrogen. The contents were heated while being stirred at 300° C. for 10 min, and then allowed to cool to room temperature. The contents were centrifuged (4000 rpm, 5 min) to separate the supernatant and precipitate. The supernatant was filtered through a 20 μm mesh membrane filter. To this, methanol was added until semiconductor nanoparticles started to precipitate, and the mixture was centrifuged (radius 146 mm, 4000 rpm, 5 min) to allow the semiconductor nanoparticles to precipitate. The precipitate was collected and dispersed in chloroform to obtain a semiconductor nanoparticle dispersion.

TABLE 9

| | AgOAc (mmol) | $In(acac)_3$ (mmol) | $Ga(acac)_3$ (mmol) | S (mmol) | $(NH_2)_2CSe$ (mmol) | Ag/ (In + Ga) | In/ (In + Ga) | S/ (S + Se) |
|---|---|---|---|---|---|---|---|---|
| Example 17 | 0.0833 | 0.025 | 0.100 | 0.092 | 0.138 | 0.67 | 0.2 | 0.4 |
| Example 18 | 0.0833 | 0.050 | 0.075 | 0.092 | 0.138 | 0.67 | 0.4 | 0.4 |

Figure 15:
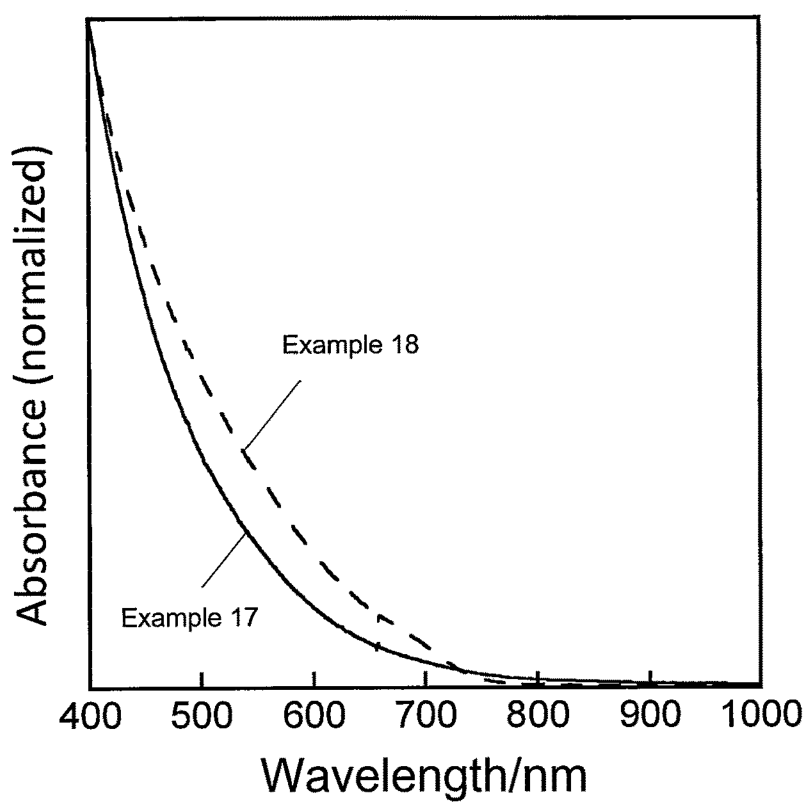
FIG. 15 is a graph showing absorption spectra of semiconductor nanoparticles according to examples described in the present disclosure.
Figure 16:
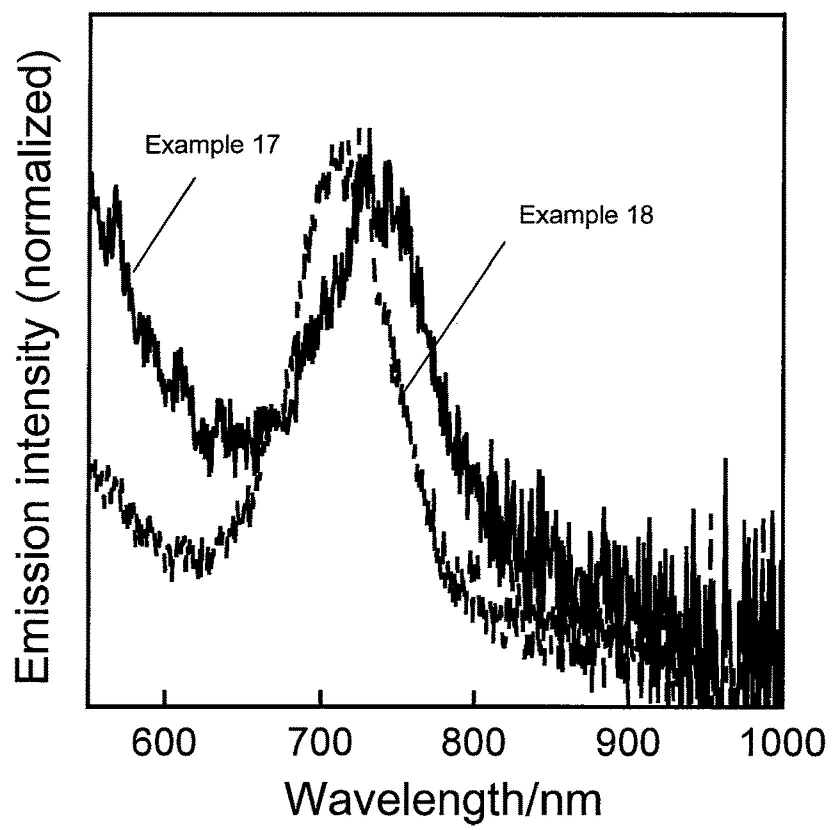
FIG. 16 is a graph showing emission spectra of semiconductor nanoparticles according to examples described in the present disclosure.

For the obtained semiconductor nanoparticles, the average particle diameter and emission properties were measured in the same manner as described above. Table 10 shows the results. FIG. 15 shows the absorption spectra normalized at 400 nm, and FIG. 16 shows emission spectra (with excitation light at 365 nm).

TABLE 10

| | Peak emission wavelength (nm) | Emission quantum yield (%) | Half bandwidth (meV) | Stokes shift (meV) | Average particle diameter (nm) |
|---|---|---|---|---|---|
| Example 17 | 740 | >1 | 250 | — | 5.0 |
| Example 18 | 708 | 1.0 | 190 | 80 | 4.7 |

Examples 19 and 20

Core-shell semiconductor nanoparticles were obtained in the same manner as Example 14 except that the semiconductor nanoparticles obtained in Examples 17 and 18 were respectively used.

Figure 17:
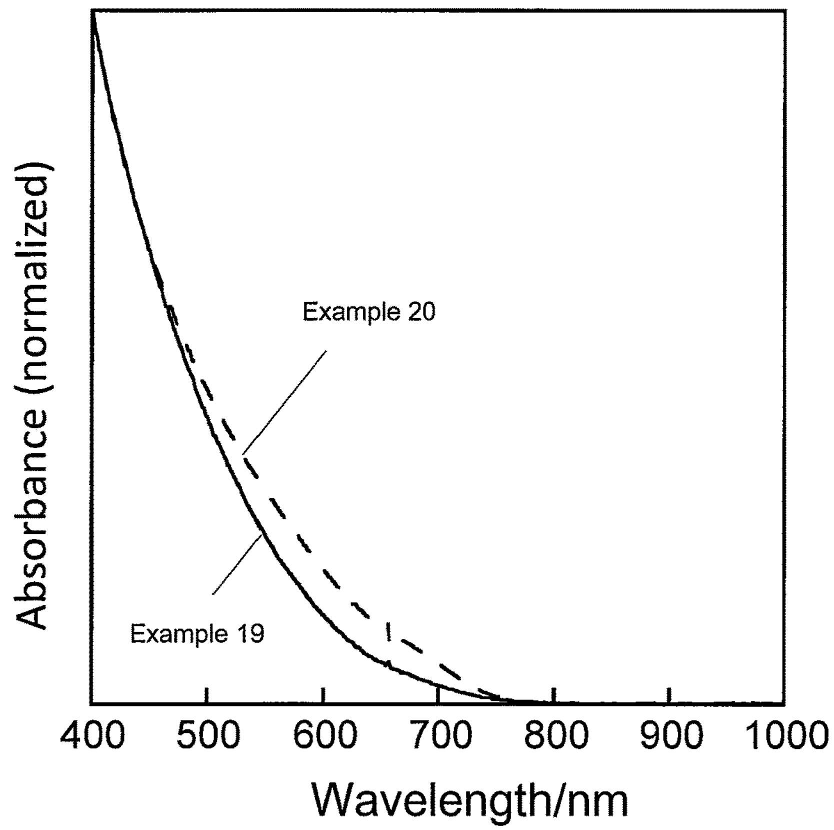
FIG. 17 is a graph showing absorption spectra of semiconductor nanoparticles according to examples described in the present disclosure.
Figure 18:
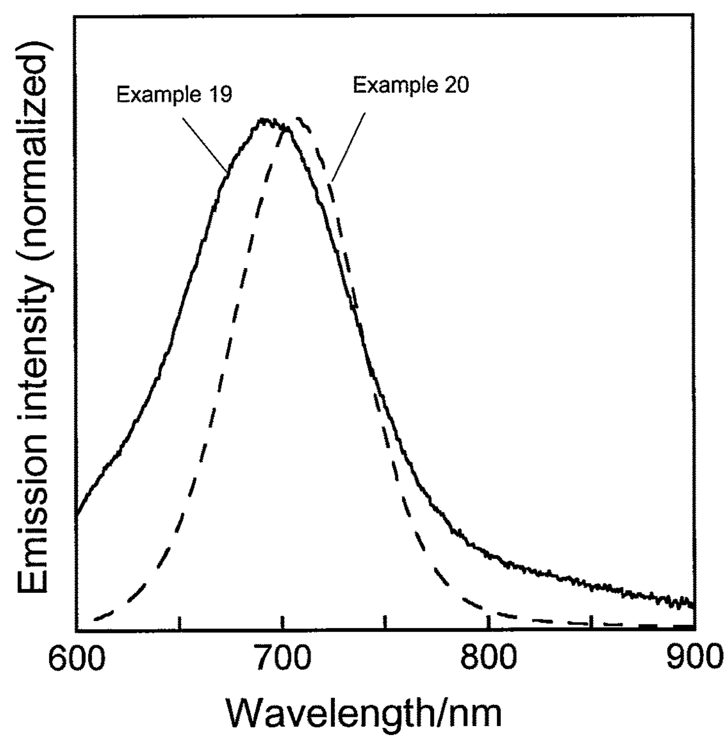
FIG. 18 is a graph showing emission spectra of semiconductor nanoparticles according to examples described in the present disclosure.

For the core-shell structured semiconductor nanoparticles obtained in Examples 19 and 20, the average particle diameter and emission properties were measured in the same manner as described above. Table 11 shows the results. FIG. 17 shows their absorption spectra normalized at 400 nm, and FIG. 18 shows their emission spectra (excitation light at 365 nm).

TABLE 11

| | Peak emission wavelength (nm) | Emission quantum yeid (%) | Half bandwidth (meV) | Stokes shift (meV) | Average particle diameter (nm) |
|---|---|---|---|---|---|
| Example 19 | 690 | >1 | 250 | — | 5.4 |
| Example 20 | 707 | 16.7 | 160 | 40 | 5.0 |

Example 21

For the core-shell structured semiconductor nanoparticles obtained in Example 20, the concentration of the dispersion was adjusted to have an absorbance at 500 nm of 1.5. In a glovebox in nitrogen atmosphere, 1.5 mL of trioctylphosphine (TOP) was added to 1.5 mL of the dispersion with the adjusted concentration, and fully stirred. This was allowed to stand for a day under protection from light to obtain TOP-treated semiconductor nanoparticles.

Figure 19:
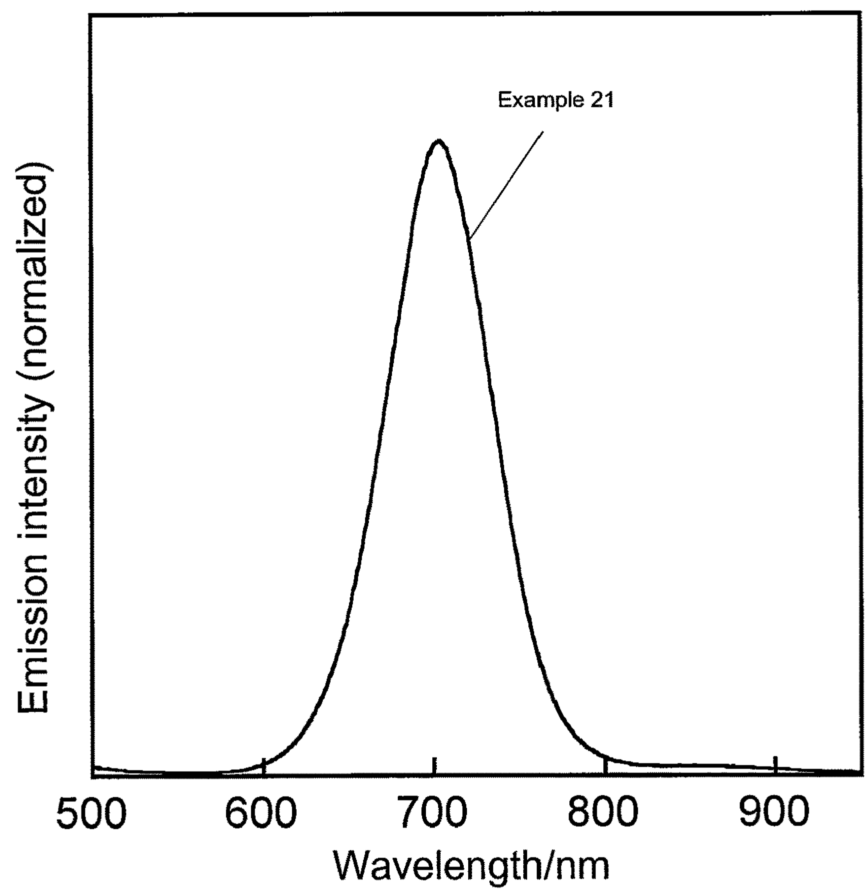
FIG. 19 is a graph showing emission spectra of semiconductor nanoparticles according to an example described in the present disclosure.

For the semiconductor nanoparticles obtained in Example 21, the emission properties were measured in the same manner as described above. FIG. 19 shows the emission spectrum (with excitation light at 365 nm).

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

Although the present disclosure has been described with reference to several exemplary embodiments, it is to be understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular examples, means, and embodiments, the disclosure may be not intended to be limited to the particulars disclosed; rather the disclosure extends to all functionally equivalent structures, methods, and uses such as are within the scope of the appended claims.

One or more examples or embodiments of the disclosure may be referred to herein, individually and/or collectively, by the term "disclosure" merely for convenience and without intending to voluntarily limit the scope of this application to any particular disclosure or inventive concept. Moreover, although specific examples and embodiments have been illustrated and described herein, it should be appreciated that any subsequent arrangement designed to achieve the same or similar purpose may be substituted for the specific examples or embodiments shown. This disclosure may be intended to cover any and all subsequent adaptations or variations of various examples and embodiments. Combinations of the above examples and embodiments, and other examples and embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure may be not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

All publications, patent applications, and technical standards mentioned in this specification are herein incorporated by reference to the same extent as if each individual publication, patent application, or technical standard was specifically and individually indicated to be incorporated by reference.

What is claimed is:

1. Semiconductor nanoparticles, comprising:

Ag;

at least one of In and Ga; and

Se and S, wherein an Ag content is 10 mol % to 30 mol %, a total content of the at least one of In and Ga is 15 mol % to 35 mol %, and an Se content is 35 mol % to 55 mol % in the semiconductor nanoparticles, wherein a ratio of a number of S atoms to a total number of Se and S atoms in the semiconductor nanoparticles is less than 1, wherein a total content of S and Se in the semiconductor nanoparticles is 35 mol % to 55 mol % or less, and wherein the semiconductor nanoparticles emit light having an emission spectrum with a peak emission wavelength in a range of 500 nm to 900 nm, and a half bandwidth of 250 meV or less upon irradiation with light in a wavelength range of 350 nm to less than 500 nm.

2. The semiconductor nanoparticles according to claim 1, wherein the semiconductor nanoparticles comprises a tetragonal crystal structure.

3. The semiconductor nanoparticles according to claim 1, wherein the semiconductor nanoparticles has an absorption spectrum with an exciton peak, and wherein the exciton peak and emission peak have an energy difference of 100 meV or less.

4. Core-shell semiconductor nanoparticles, comprising:

a core containing semiconductor nanoparticles according to claim 1; and a shell arranged on a surface of the core, and containing a semiconductor material consisting essentially of a Group 13 element and a Group 16 element, wherein the core-shell semiconductor nanoparticles emit light upon irradiation with light.

5. The core-shell semiconductor nanoparticles according to claim 4, wherein the Group 13 element includes Ga.

6. The core-shell semiconductor nanoparticles according to claim 4, wherein the Group 16 element includes S.

7. The core-shell semiconductor nanoparticles according to claim 4, wherein a compound containing a Group 15 element with a negative oxidation number is arranged on a surface of the shell.

8. The semiconductor nanoparticles according to claim 7, wherein the compound containing a Group 15 element with a negative oxidation number contains at least P with a negative oxidation number.

9. A light-emitting device, comprising:

a light conversion member containing the semiconductor nanoparticles according to claim 1; and a semiconductor light-emitting element.

10. The light-emitting device according to claim 9, wherein the semiconductor light-emitting element is an LED chip.

11. Semiconductor nanoparticles, comprising:

Ag;

at least one of In and Ga;

Se; and an alkali metal, wherein an Ag content is 10 mol % to 30 mol %, a total content of the at least one of In and Ga is 15 mol % to 35 mol %, and an Se content is 35 mol % to 55 mol % in the semiconductor nanoparticles, wherein a ratio of a number of atoms of the alkali metal to a total number of atoms of the alkali metal and Ag in the semiconductor nanoparticles is less than 1, and a sum of the Ag content and the alkali metal content in the semiconductor nanoparticles is 10 mol % to 30 mol %, and wherein the semiconductor nanoparticles emit light having an emission spectrum with a peak emission wavelength in a range of 500 nm to 900 nm, and a half bandwidth of 250 meV or less upon irradiation with light in a wavelength range of 350 nm to less than 500 nm.

12. The semiconductor nanoparticles according to claim 11, further comprising S, wherein a ratio of a number of S atoms to a total number of Se and S atoms in the semiconductor nanoparticles is less than 1, and a total content of S and Se in the semiconductor nanoparticles is 35 mol % to 55 mol % or less.

13. The semiconductor nanoparticles according to claim 11, wherein the semiconductor nanoparticles comprises a tetragonal crystal structure.

14. The semiconductor nanoparticles according to claim 11, wherein the semiconductor nanoparticles has an absorption spectrum with an exciton peak, and wherein the exciton peak and emission peak have an energy difference of 100 meV or less.

15. Core-shell semiconductor nanoparticles, comprising:

a core containing semiconductor nanoparticles according to claim 11; and a shell arranged on a surface of the core, and containing a semiconductor material consisting essentially of a Group 13 element and a Group 16 element, wherein the core-shell semiconductor nanoparticles emit light upon irradiation with light.

16. The core-shell semiconductor nanoparticles according to claim 15, wherein the Group 13 element includes Ga.

17. The core-shell semiconductor nanoparticles according to claim 15, wherein the Group 16 element includes S.

18. The core-shell semiconductor nanoparticles according to claim 15, wherein a compound containing a Group 15 element with a negative oxidation number is arranged on a surface of the shell.

19. The semiconductor nanoparticles according to claim 18, wherein the compound containing a Group 15 element with a negative oxidation number contains at least P with a negative oxidation number.

20. A light-emitting device, comprising:

a light conversion member containing the semiconductor nanoparticles according to claim 11; and a semiconductor light-emitting element.

21. The light-emitting device according to claim 20, wherein the semiconductor light-emitting element is an LED chip.

* * * * *